(12) United States Patent
Hashimoto

(10) Patent No.: US 10,608,412 B2
(45) Date of Patent: Mar. 31, 2020

(54) QUANTUM CASCADE LASER, LIGHT EMITTING APPARATUS

(71) Applicant: SUMITOMO ELECTRIC INDUSTRIES, LTD., Osaka (JP)

(72) Inventor: Jun-ichi Hashimoto, Osaka (JP)

(73) Assignee: SUMITOMO ELECTRIC INDUSTRIES, LTD., Osaka (JP)

(*) Notice: Subject to any disclaimer, the term of this patent is extended or adjusted under 35 U.S.C. 154(b) by 0 days.

(21) Appl. No.: 16/009,044

(22) Filed: Jun. 14, 2018

(65) Prior Publication Data

US 2018/0366912 A1    Dec. 20, 2018

(30) Foreign Application Priority Data

Jun. 19, 2017  (JP) ................. 2017-119596
Jun. 19, 2017  (JP) ................. 2017-119598

(Continued)

(51) Int. Cl.
*H01S 5/34*        (2006.01)
*H01S 5/026*       (2006.01)
(Continued)

(52) U.S. Cl.
CPC ............ *H01S 5/3402* (2013.01); *H01S 5/026* (2013.01); *H01S 5/028* (2013.01); *H01S 5/0286* (2013.01);
(Continued)

(58) Field of Classification Search
CPC ... H01S 5/3401–3402; H01S 5/16–168; H01S 5/028–0288; H01S 5/22–24;
(Continued)

(56) References Cited

U.S. PATENT DOCUMENTS 4,751,710 A * 6/1988 Yamaguchi ........... H01S 5/0264
                                                  372/44.01
4,962,985 A * 10/1990 LeGrange ............ G02B 6/4204
                                                  257/E31.119

(Continued)

FOREIGN PATENT DOCUMENTS

DE     102008045980   *  6/2010 ............. B82Y 20/00
DE     102015116335   *  3/2017 ............ H01S 5/0421

OTHER PUBLICATIONS

Manijeh Razeghi, "High-Performance InP-Based Mid-IR Quantum Cascade Lasers", *IEEE Journal of Selected Topics in Quantum Electronics*, vol. 15, No. 3, p. 941-p. 951, May/Jun. 2009.

(Continued)

*Primary Examiner* — Joshua King
(74) *Attorney, Agent, or Firm* — Smith, Gambrell & Russell, LLP.

(57) ABSTRACT

A light emitting apparatus includes: a submount including a mounting face and an end face, and the end face having an upper edge apart from a front edge of the mounting face; and a quantum cascade laser disposed on the front edge and the mounting face. The quantum cascade laser includes: a laser structure having first, and second faces; a first electrode on the first face; a second electrode on the second face; and a reflecting structure on a first end face of the laser structure. The reflecting structure includes an insulating film having a first end on the first face and a second end on the second face, and a metal film having a first end on the first face, and a second end on the second face. The insulating film is disposed between the laser structure and the first end and the second end of the metal film.

25 Claims, 20 Drawing Sheets

(30) Foreign Application Priority Data

| Jun. 22, 2017 | (JP) | 2017-122339 |
| Jun. 27, 2017 | (JP) | 2017-125259 |
| Jun. 27, 2017 | (JP) | 2017-125264 |
| Jun. 27, 2017 | (JP) | 2017-125267 |
| Feb. 6, 2018 | (JP) | 2018-019201 |

(51) Int. Cl.

| H01S 5/024 | (2006.01) |
| H01S 5/042 | (2006.01) |
| H01S 5/022 | (2006.01) |
| H01S 5/22 | (2006.01) |
| H01S 5/028 | (2006.01) |
| H01S 5/227 | (2006.01) |
| H01S 5/02 | (2006.01) |
| H01S 5/12 | (2006.01) |

(52) U.S. Cl.
CPC ...... *H01S 5/02236* (2013.01); *H01S 5/02252* (2013.01); *H01S 5/02461* (2013.01); *H01S 5/0425* (2013.01); *H01S 5/22* (2013.01); *H01S 5/2206* (2013.01); *H01S 5/0202* (2013.01); *H01S 5/0282* (2013.01); *H01S 5/02268* (2013.01); *H01S 5/02272* (2013.01); *H01S 5/02492* (2013.01); *H01S 5/12* (2013.01); *H01S 5/227* (2013.01); *H01S 5/3401* (2013.01); *H01S 2301/176* (2013.01)

(58) Field of Classification Search
CPC ... H01S 5/02236–02276; H01S 5/0226; H01S 5/02272; H01S 5/02469; H01S 5/02484; H01S 5/02476; H01S 5/02492; H01S 5/2206

See application file for complete search history.

(56) References Cited

U.S. PATENT DOCUMENTS

| 5,180,685 | A | * | 1/1993 | Yamamoto | H01L 33/0062 148/DIG. 72 |
| 5,677,922 | A | * | 10/1997 | Hayafuji | B82Y 20/00 372/46.01 |
| 5,943,553 | A | * | 8/1999 | Spaeth | H01L 33/641 372/107 |
| 6,289,030 | B1 | * | 9/2001 | Charles | H01L 31/02161 257/437 |
| 6,326,646 | B1 | * | 12/2001 | Baillargeon | B82Y 20/00 257/94 |
| 6,355,505 | B1 | * | 3/2002 | Maeda | H01S 5/02236 438/122 |
| 6,647,047 | B2 | * | 11/2003 | Yokota | H01S 5/0281 372/49.01 |
| 6,710,375 | B2 | * | 3/2004 | Oshima | H01S 5/0281 257/21 |
| 9,184,563 | B1 | * | 11/2015 | Raring | H01S 5/2201 |
| 2003/0035453 | A1 | * | 2/2003 | Fitz | H01S 5/028 372/49.01 |
| 2004/0101013 | A1 | * | 5/2004 | Yokota | H01S 5/028 372/46.013 |
| 2004/0233950 | A1 | * | 11/2004 | Furukawa | H01S 5/028 372/43.01 |
| 2005/0151150 | A1 | * | 7/2005 | Choi | H01S 5/0425 257/99 |
| 2006/0239321 | A1 | * | 10/2006 | Kume | B82Y 20/00 372/50.121 |
| 2006/0274804 | A1 | * | 12/2006 | Behfar | H01S 5/028 372/49.01 |
| 2009/0067464 | A1 | * | 3/2009 | Tanaka | B82Y 20/00 372/45.011 |
| 2009/0086782 | A1 | * | 4/2009 | Yokoyama | B82Y 20/00 372/49.01 |
| 2010/0127154 | A1 | * | 5/2010 | Kameyama | B82Y 20/00 250/201.1 |
| 2010/0197057 | A1 | * | 8/2010 | Tsuji | H01S 5/12 438/32 |
| 2013/0028280 | A1 | * | 1/2013 | Hongo | H01S 5/02461 372/44.01 |
| 2013/0107534 | A1 | * | 5/2013 | Avramescu | H01S 5/02461 362/259 |
| 2013/0250994 | A1 | * | 9/2013 | Moenster | H01S 5/02272 372/50.12 |
| 2013/0301666 | A1 | * | 11/2013 | Stagarescu | H01S 5/3013 372/44.01 |
| 2013/0322480 | A1 | * | 12/2013 | Edamura | H01S 5/3401 372/45.01 |
| 2014/0211819 | A1 | * | 7/2014 | Yoshida | H01S 5/02272 372/36 |
| 2014/0239250 | A1 | * | 8/2014 | Fang | H01L 33/06 257/13 |
| 2015/0117484 | A1 | * | 4/2015 | Sugiyama | H01S 5/0285 372/45.01 |
| 2015/0318668 | A1 | * | 11/2015 | Yoshinaga | H01S 5/3401 372/45.012 |
| 2018/0069374 | A1 | | 3/2018 | Kakuno et al. | |

OTHER PUBLICATIONS

S.R. Darvish, et al., "High-power, continuous-wave operation of distributed-feedback quantum-cascade lasers at λ 7.8 μm", *Applied Physics Letters*, 89, 251119 (2006).

* cited by examiner

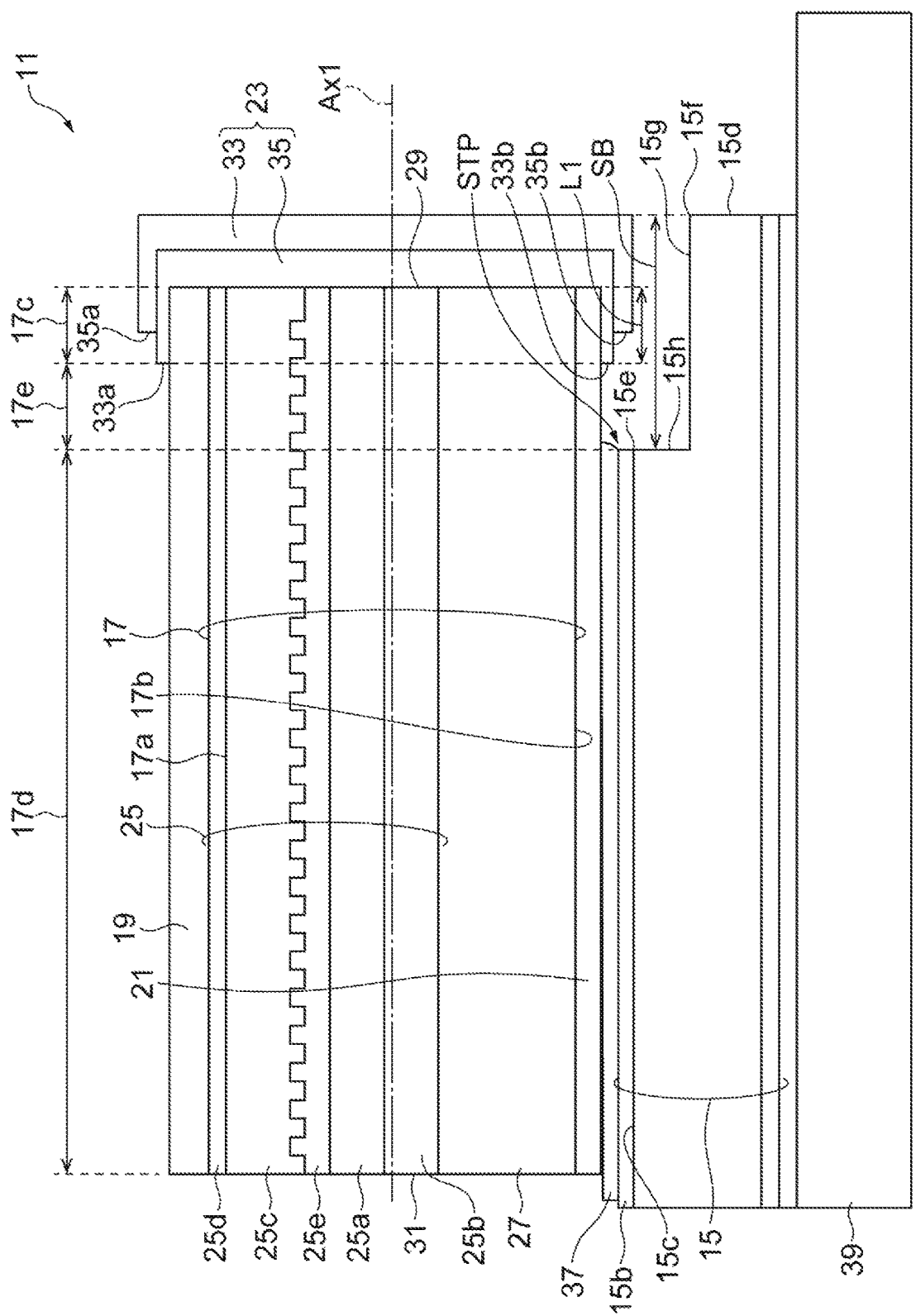

QUANTUM CASCADE LASER, LIGHT EMITTING APPARATUS

BACKGROUND OF THE INVENTION

Field of the Invention

The present invention relates to a quantum cascade laser, and a light emitting apparatus including the quantum cascade laser and a quantum cascade laser. This application claims the benefit of priorities from Japanese Patent Application No. 2017-119598 filed on Jun. 19, 2017, Japanese Patent Application No. 2017-119596 filed on Jun. 19, 2017, Japanese Patent Application No. 2017-122339 filed on Jun. 22, 2017, Japanese Patent Application No. 2017-125267 filed on Jun. 27, 2017, Japanese Patent Application No. 2017-125259 filed on Jun. 27, 2017, Japanese Patent Application No. 2017-125264 filed on Jun. 27, 2017, and Japanese Patent Application No. 2018-019201 filed on Feb. 6, 2018, which are herein incorporated by reference in their entirety.

Related Background Art

Non-Patent Document 1 (Applied Physics Letters, vol. 89, 251119, 2006) discloses a quantum cascade laser.

SUMMARY OF THE INVENTION

A quantum cascade laser according to one aspect of the present invention includes: a laser structure including a waveguide mesa extending in a direction of a first axis, and a substrate mounting the waveguide mesa, the laser structure including a first end face, a first face and a second face, the first end face terminating the waveguide mesa, and the first face and the second face being arranged in a direction of a second axis intersecting that of the first axis; a first electrode disposed on the first face; a second electrode disposed on the second face; and a reflecting structure on the laser structure. The laser structure includes a first region, a second region, and a third region, and the first region, the second region, and the third region are arranged in the direction of the first axis. The first region has the end face, and the third region is disposed between the first region and the second region. The laser structure includes an insulating film and a metal film. The metal film has a first end on the first face of the first region, and a second end on the second face of the first region, and the metal film extends on the first electrode, the second electrode, and the first end face from the first end thereof to the second end thereof. The insulating film has a first end on the first face of the first region, and a second end on the second face of the first region, and the insulating film extends from the first end thereof to the second end thereof, and the insulating film being in contact with the first end face.

A light emitting apparatus according to another aspect of the present invention includes: a submount including a mounting face and an end face, the submount having a conductive layer on the mounting face, and the end face having an upper edge apart from a front edge of the mounting face; and a quantum cascade laser disposed on the front edge and the mounting face. The quantum cascade laser includes: a laser structure having a waveguide mesa extending in a direction of a first axis and a substrate mounting the waveguide mesa, the laser structure having a first end face, a first face, and a second face, the first end face terminating the waveguide mesa, and the first face and the second face being arranged in a direction of a second axis intersecting the direction of the first axis; a first electrode disposed on the first face; a second electrode disposed on the second face; and a reflecting structure on the laser structure. The laser structure has a first region, a second region, and a third region. The first region, the second region, and the third region of the laser structure are arranged in the direction of the first axis. The first region of the laser structure has the end face. The mounting face of the submount supports the second region of the laser structure, and in the laser structure, the third region is disposed between the first region and the second region. The reflecting structure includes an insulating film and a metal film. The metal film has a first end on the first face of the first region, and a second end on the second face of the first region, and the metal film extends on the first electrode, the first end face and the second electrode from the first end thereof to the second end thereof. The insulating film has a first end on the first face of the first region, and a second end on the second face of the first region. The insulating film is in contact with the first end face and extends from the first end thereof to the second end thereof. The insulating film is disposed between the laser structure and the first end and the second end of the metal film.

BRIEF DESCRIPTION OF THE DRAWINGS

The above-described objects and the other objects, features, and advantages of the present invention become more apparent from the following detailed description of the preferred embodiments of the present invention proceeding with reference to the attached drawings.

FIG. 9 is a cross-sectional view showing a light emitting apparatus according to Example 1.

DESCRIPTION OF THE EMBODIMENTS

Figure 1:
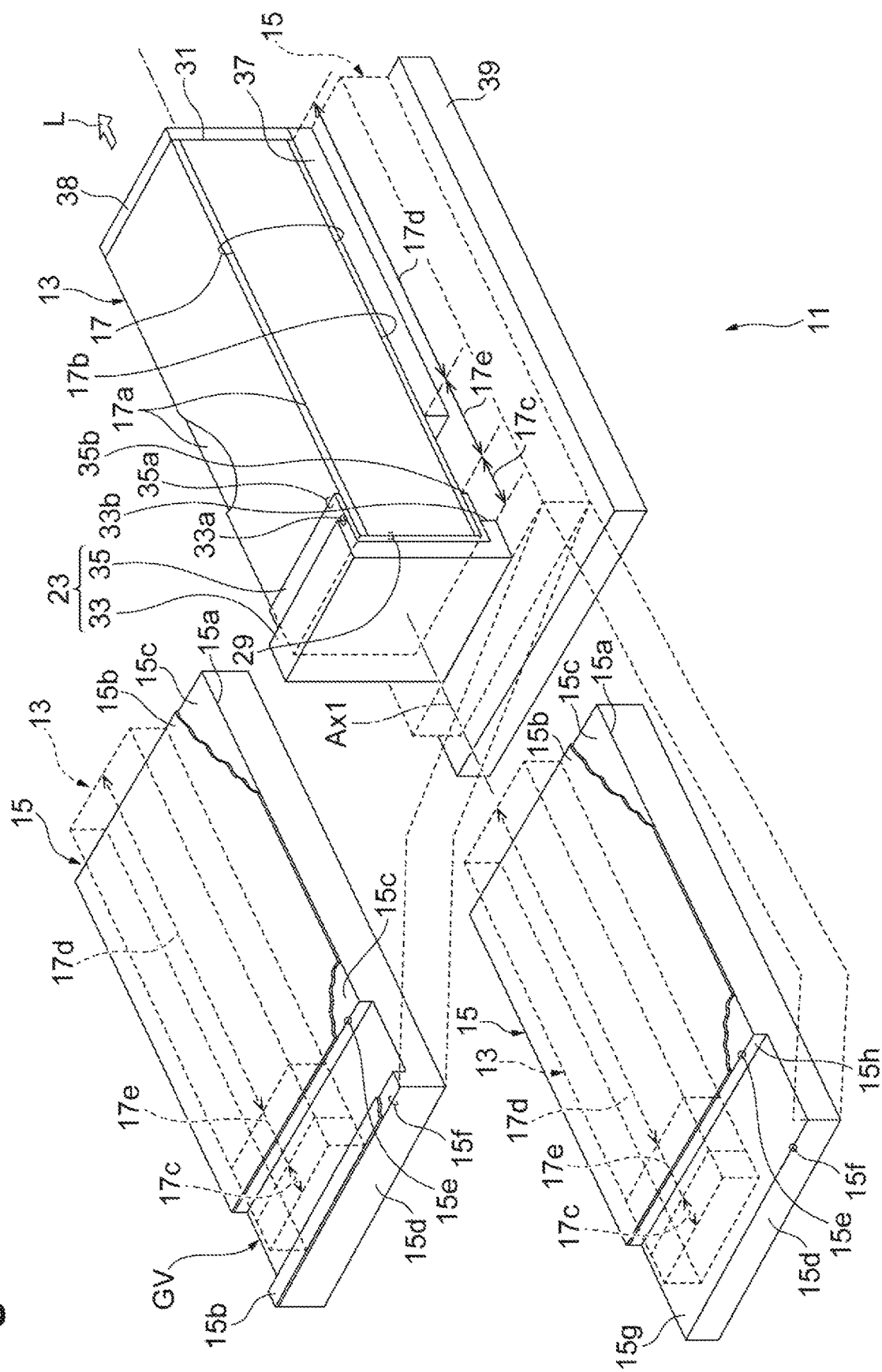
FIG. 1 is a schematic view showing a light emitting apparatus according to the present embodiment.

The quantum cascade laser that includes a reflecting structure having a metal film on the rear end face enables low threshold current and dissipation of heat from the rear end face. The quantum cascade laser also includes a waveguide mesa reaching the rear end facet, and the metal film making contact with the rear end face causes a short circuit between cladding layers located on and under the core layer. Providing an insulating film between the rear end face and the metal film can prevent the metal film from making contact with the rear end face.

The quantum cascade laser has a waveguide mesa in a laser structure, and the waveguide mesa receives carriers from first and second electrodes, which are mounted on top and back sides of the laser structure, respectively.

The insulating and metal films are arranged to form a structure on the rear end face of the quantum cascade laser, and this structure may short-circuit the quantum cascade laser in applying electric power to the quantum cascade laser. The inventor's observations find that deposited materials of insulator and metal layers are formed on the first and second electrodes on the laser structure and accidentally make short-circuit between the first and second electrodes.

It is an object of one aspect of the present invention to provide a quantum cascade laser with a structure that can reduce the occurrence of short-circuit between the metal film on the rear end face having the metal film and the first and second electrodes of the laser structure. It is an object of another aspect of the present invention to provide a light emitting apparatus that includes a submount and the quantum cascade laser mounted on the submount.

A description will be given of embodiments according to the present above aspects below.

A light emitting apparatus according to an embodiment includes: (a) a submount including a mounting face and an end face, the submount having a conductive layer on the mounting face, and the end face having an upper edge apart from a front edge of the mounting face; and (b) a quantum cascade laser disposed on the front edge and the mounting face. The quantum cascade laser includes: a laser structure having a waveguide mesa extending in a direction of a first axis and a substrate mounting the waveguide mesa, the laser structure having a first end face, a first face, and a second face, the first end face terminating the waveguide mesa, and the first face and the second face being arranged in a direction of a second axis intersecting the direction of the first axis; a first electrode disposed on the first face; a second electrode disposed on the second face; and a reflecting structure on the laser structure. The laser structure has a first region, a second region, and a third region. The first region, the second region, and the third region of the laser structure are arranged in the direction of the first axis. The first region of the laser structure has the end face. The mounting face of the submount supports the second region of the laser structure, and in the laser structure, the third region is disposed between the first region and the second region. The reflecting structure includes an insulating film and a metal film. The metal film has a first end on the first face of the first region, and a second end on the second face of the first region, and the metal film extends on the first electrode, the first end face and the second electrode from the first end thereof to the second end thereof. The insulating film has a first end on the first face of the first region, and a second end on the second face of the first region. The insulating film is in contact with the first end face and extends from the first end thereof to the second end thereof. The insulating film is disposed between the laser structure and the first end and the second end of the metal film.

The light emitting apparatus provides the submount with the mounting face that is apart from the upper edge of the end face thereof, and the mounting face of the submount supports the second region of the laser structure without supporting the third region. This supporting can separate the metal film of the reflecting structure from the conductive layer on the mounting face.

The reflecting structure of the quantum cascade laser is disposed on the laser structure, and is provided for the cavity. The reflecting structure includes the metal and insulating films, and these films are also provided on the first and second faces of the first region.

Specifically, the metal film of the reflecting structure has a structure that has a major portion on the first end face, and first and second portions, which are located on the first and second faces of the first region, respectively. Forming the first and second portions adjoining the major portion of the metal film can provide the major portion with a desired thickness.

The insulating film is located between the laser structure and the first and second edges of the metal film, and makes contact with the first end face. Specifically, in the insulating film, the major portion is located on the first end face and makes contact with the first end face, and the first and second portions are located on the first and second faces of the first region, respectively, so as to adjoin the major portion. Forming the first and second portions continuous to the major portion can provide a desired thickness to not only the major portion but also the first and second portions to prevent the metal film from making contact with the first end face.

The insulating film is disposed between the first and second edges of the metal film and the first and second faces of the laser structure, respectively, to prevent the metal film from covering the first and second edges of the insulating film. This prevention of coverage can reliably separate the metal film from the first and second electrodes of the quantum cascade laser.

A quantum cascade laser according to an embodiment includes: (a) a laser structure including a waveguide mesa extending in a direction of a first axis, and a substrate mounting the waveguide mesa, the laser structure including a first end face, a first face and a second face, the first end face terminating the waveguide mesa, and the first face and the second face being arranged in a direction of a second axis intersecting that of the first axis; (b) a first electrode disposed on the first face; (c) a second electrode disposed on the second face; and (d) a reflecting structure on the laser structure. The laser structure includes a first region, a second region, and a third region, and the first region, the second region, and the third region are arranged in the direction of the first axis. The first region has the end face, and the third region is disposed between the first region and the second region. The laser structure includes an insulating film and a metal film. The metal film has a first end on the first face of the first region, and a second end on the second face of the first region, and the metal film extends on the first electrode, the second electrode, and the first end face from the first end thereof to the second end thereof. The insulating film has a first end on the first face of the first region, and a second end on the second face of the first region, and the insulating film extends from the first end thereof to the second end thereof, and the insulating film being in contact with the first end face.

The quantum cascade laser can provide the optical cavity with the reflecting structure on the laser structure. The metal and insulating films of the reflecting structure both are formed on the first and second faces of the first region.

Specifically, the metal film of the reflecting structure has a structure with a major portion on the first end face, and first and second portions, which are on the first and second faces of the first region, respectively. Specifically, in the metal film, forming the first and second portions continuous to the major portion allows the major portion to have a desired thickness.

The insulating film makes contact with the first end face, and is located between the laser structure and the first and second edges of the metal film. The insulating film has a major portion in contact with and on the first end face, and has first and second portions, which adjoin the major portion, on the first and second faces of the first region, respectively. Forming the first and second portions continuous to the major portion can provide the first and second portions and the major portion with respective desired thicknesses to prevent the metal film from making contact with the first end face.

In the quantum cascade laser, the insulating film is between the laser structure and the first and second edges of the metal film on the first and second faces of the laser structure to prevent the metal film from covering the first and second edges of the insulating film, so that the reflecting structure separates the metal film from the first and second electrodes thereof.

In the light emitting apparatus according to an embodiment, the end face of the submount extends along a reference plane intersecting the first axis, and the quantum cascade laser does not extend beyond the reference plane.

The light emitting apparatus allows the quantum cascade laser to be inside with respect to the reference plane, thereby preventing the quantum cascade laser from accidental damage.

In the light emitting apparatus according to an embodiment, the laser structure has a second end face opposite to the first end face, the submount has a protrusion protruding from the mounting face, and the protrusion positions the second end face of the quantum cascade laser.

In the light emitting apparatus, positioning the quantum cascade laser to the second end face thereof makes it possible to accurately determine the position of the second end face relative to the submount.

In the light emitting apparatus according to an embodiment, the second electrode is in contact with the substrate, and has an end apart from a lower edge of the first end face.

The light emitting apparatus allows the second electrode to be apart from the first end face.

In the light emitting apparatus according to an embodiment, the submount has a difference in level at the front end of the mounting face, and a recessed face extending from the upper edge of the end face to a bottom of the difference in level, the submount has a side end face at the difference in level, and the side end face extends to connect the mounting face to the recessed face, and the recessed face is apart from the reflecting structure.

The light emitting apparatus allows the recessed face of the submount to extend from the upper edge of the end face to the side end face of the difference in level, which is positioned to the end of the mounting face, in the direction of the first axis, thereby separating the reflecting structure of the quantum cascade laser from the conductive layer on the submount.

In the light emitting apparatus according to an embodiment, the conductive layer of the submount is disposed on the side end face.

The light emitting apparatus provides the side end face of the difference in level with the conductive layer to prevent the solder material on the mounting face from reaching the reflecting structure.

In the light emitting apparatus according to an embodiment, the submount has one or more grooves terminating the mounting face and extending a direction of a third axis intersecting the direction of the first and second axes; the submount has a first region, a second region, and a third region arranged in the direction of the first axis; the first region of the submount has the end face; the second region of the submount has the mounting face; and the third region of the submount has the one or more grooves; in the submount, the second region is disposed between the first region and the second region, and the submount supports the quantum cascade laser on the first region and the second region thereof.

The light emitting apparatus provides the submount with the grooves, which can separate the first and second regions of the submount from each other, so that the submount supports the quantum cascade laser on the first and second regions thereof without the quantum cascade laser being supported on the third region of the submount.

The light emitting apparatus according to an embodiment further includes a solder material fixing the second electrode of the quantum cascade laser to the conductive layer.

The light emitting apparatus allows the submount to separate the solder material on the conductive layer from the reflecting structure.

In the light emitting apparatus according to an embodiment, the solder material includes at least one of AuSn, Sn, SnPb, AgSn, In or Ag paste.

The light emitting apparatus can use the above-mentioned solder material.

In the light emitting apparatus according to an embodiment, the submount includes at least one of AlN, CuW, CuMo, or diamond.

The light emitting apparatus can use the above-described submount material.

The light emitting apparatus according to an embodiment further include a carrier, which mounts the submount and is die-bonded to the submount.

In the light emitting apparatus, the submount may be die-bonded to the carrier.

In the light emitting apparatus according to an embodiment, the carrier includes at least one of Cu, CuW, Fe alloy, or brass.

In the light emitting apparatus, the carrier may be made of material described above.

In the light emitting apparatus and the quantum cascade laser according to an embodiment, the insulating film includes at least one of $SiO_2$, SiON, SiN, alumina, BCB, or polyimide.

In the light emitting apparatus and the quantum cascade laser, the insulating film can be made of material described above.

In the light emitting apparatus and the quantum cascade laser according to an embodiment, the metal film includes Au.

In the light emitting apparatus and the quantum cascade laser, the metal film may be made of gold.

Teachings of the present invention can be readily understood by considering the following detailed description with reference to the accompanying drawings shown as examples. Referring to the accompanying drawings, a light emitting apparatus, a quantum cascade laser, and a method for fabricating a quantum cascade laser according to the present invention will be described below. To facilitate understanding, identical reference numerals are used, where possible, to designate identical elements that are common to the figures.

Figure 2:
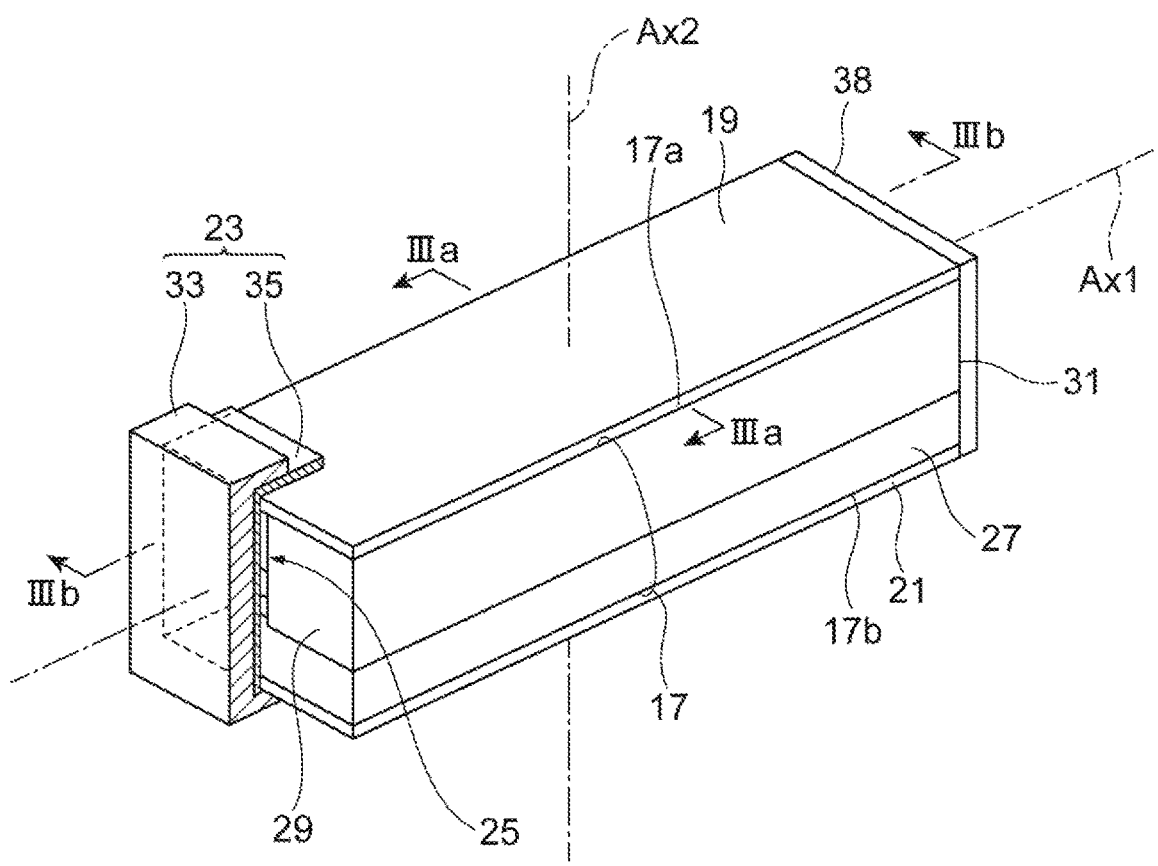
FIG. 2 is a partially cutaway schematic view showing a reflection end of the quantum cascade laser of the light emitting apparatus according to the embodiment.
Figure 3A:
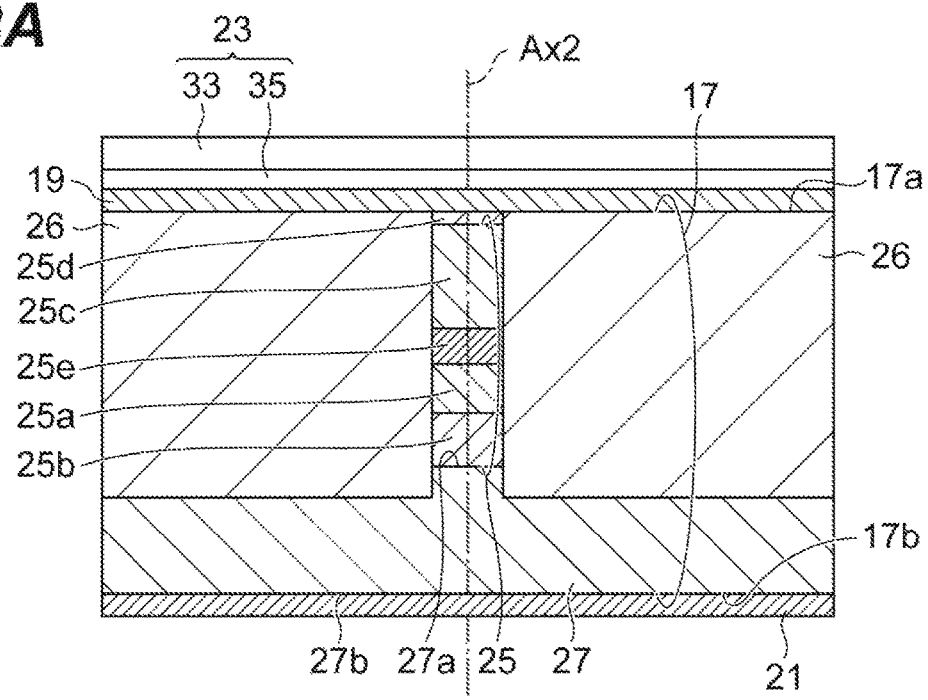
FIG. 3A is a cross-sectional view taken along line IIIa-IIIa shown in FIG. 2.
Figure 3B:
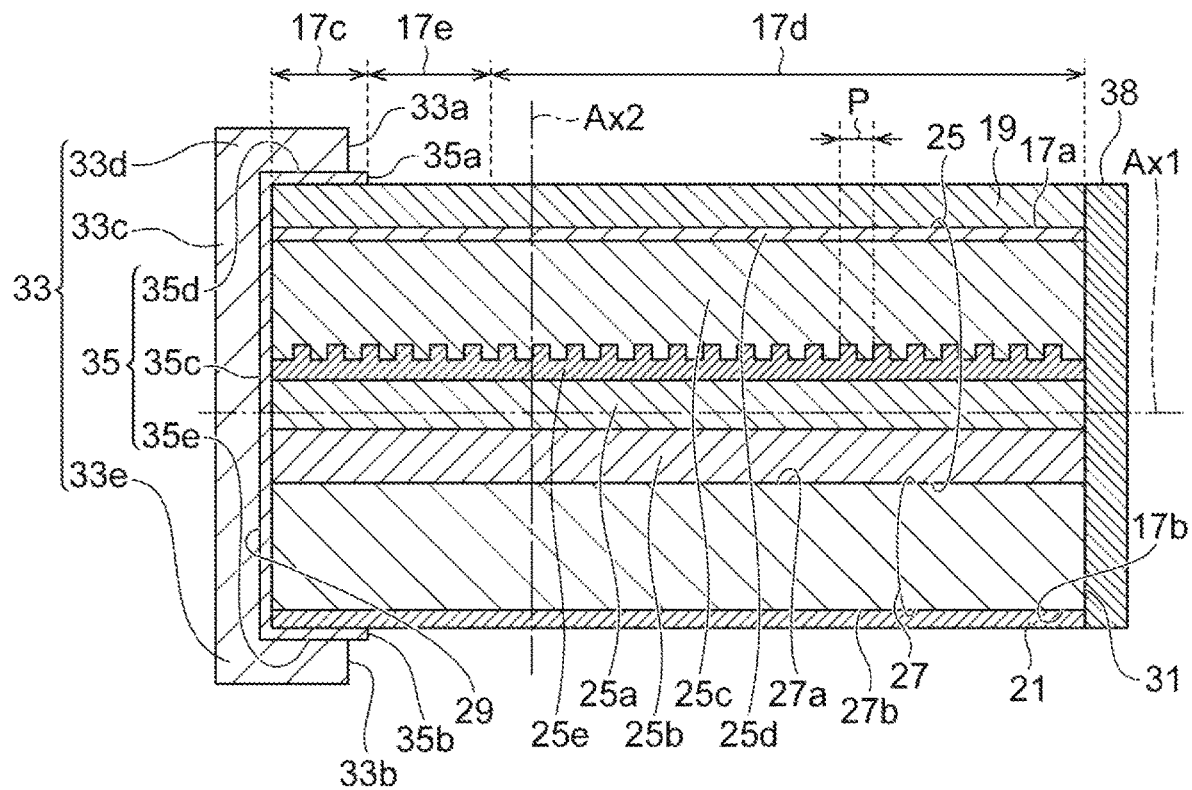
FIG. 3B is a cross-sectional view taken along line IIIb-IIIb shown in FIG. 2.
Figure 4A:
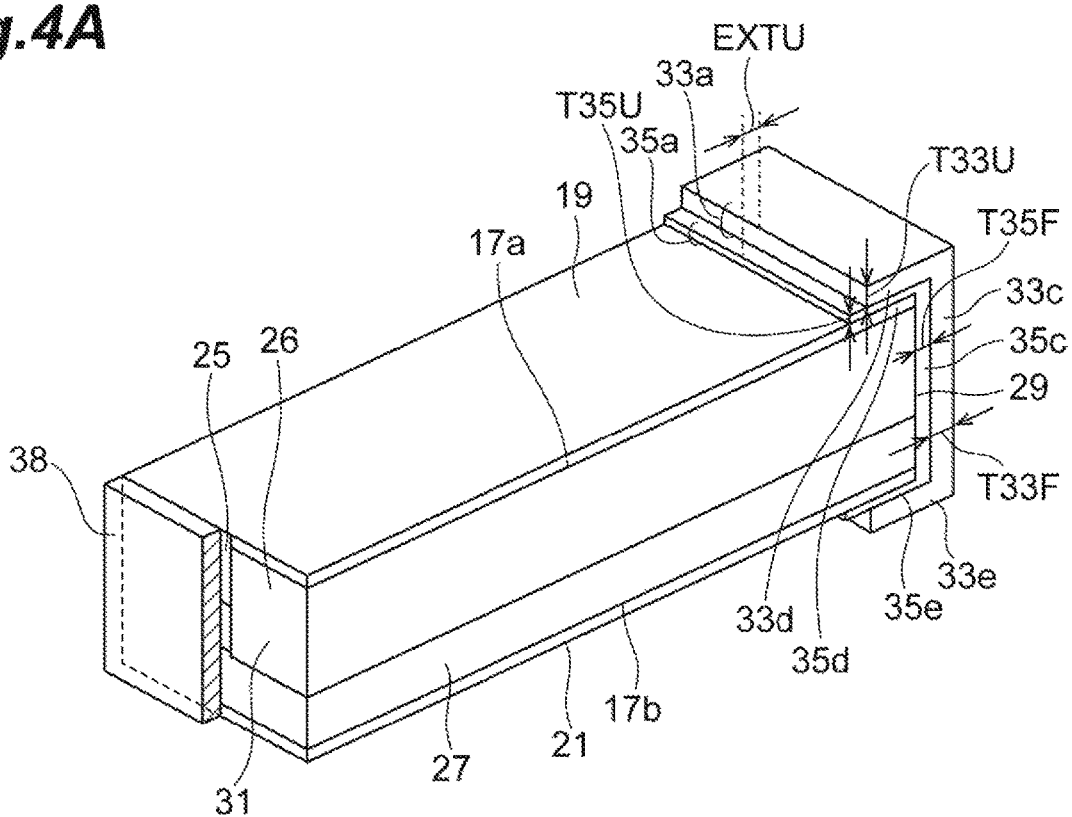
FIG. 4A is a partially cutaway schematic top view showing an emission end of the quantum cascade laser according to the embodiment.
Figure 4B:
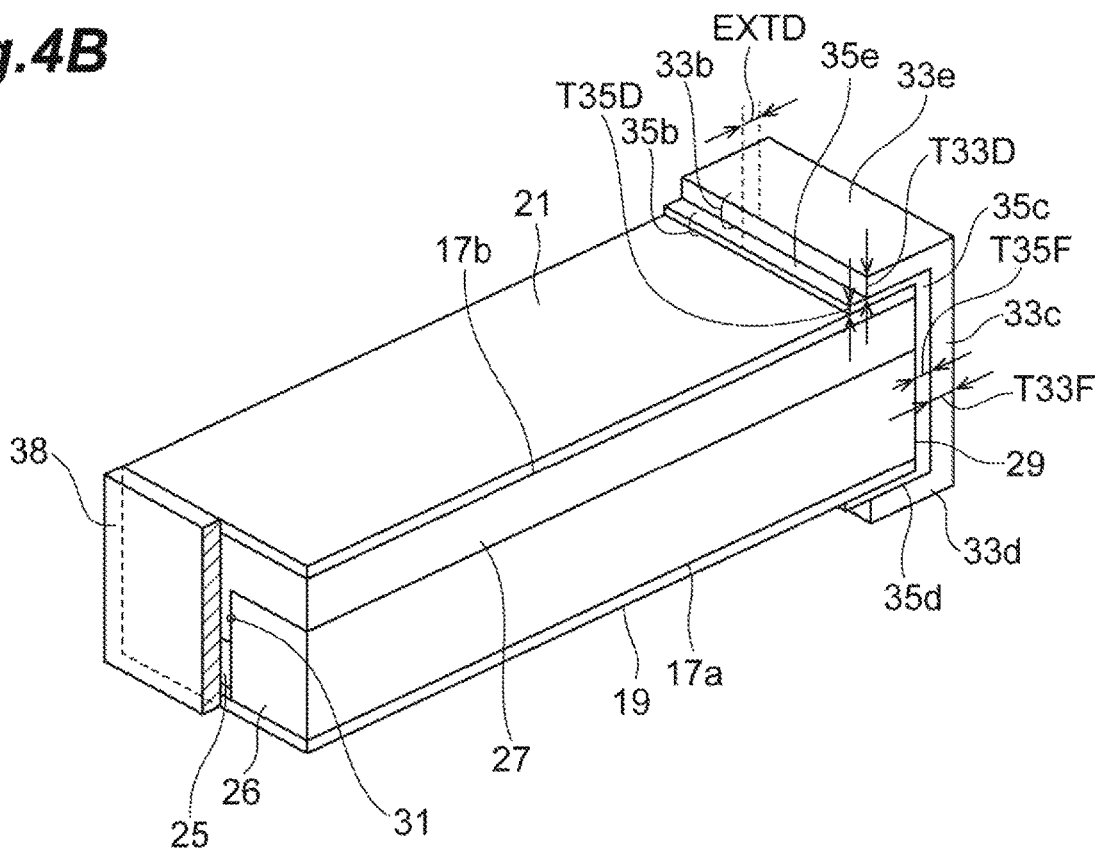
FIG. 4B is a partially cutaway schematic bottom view showing an emission end of the quantum cascade laser according to the embodiment.

FIG. 1 is a schematic view showing a light emitting apparatus according to the present embodiment. FIG. 2 is a partially cutaway schematic view showing the reflective end of the quantum cascade laser and the light emitting apparatus according to the present embodiment. FIG. 3A is a cross sectional view, taken along line IIIa-IIIa shown in FIG. 2. FIG. 3B is a cross sectional view taken along line IIIb-IIIb shown in FIG. 2. FIGS. 4A and 4B are partially cutaway schematic views each showing the emission end of the quantum cascade laser according to the embodiment.

Referring to FIG. 1, the light emitting apparatus 11 includes a quantum cascade laser 13 and a sub mount 15. The quantum cascade laser 13 is disposed on the submount 15.

Referring to FIGS. 1, 2, 3A, 3B, 4A and 4B, the quantum cascade laser 13 includes a laser structure 17, a first electrode 19, a second electrode 21, and a reflecting structure 23. The laser structure 17 includes a waveguide mesa 25 extending in a direction of a first axis Ax1, a substrate 27 mounting the waveguide mesa 25, a first end face 29, and a second end face 31. The first and second end faces 29 and 31 are arranged in the direction of the first axis Ax1. The waveguide mesa 25 terminates at the first end face 29, and in the embodiment, the waveguide mesa 25 extends from the second end face 31 to the first end face 29. The laser structure 17 has a first face 17a and a second face 17b, and the first and second faces 17a and 17b are arranged in a direction of a second axis Ax2 intersecting that of the first axis Ax1, and extend in the direction of the first axis Ax1. The first and second electrodes 19 and 21 are disposed on the first and second faces 17a and 17b, respectively, and specifically, are in contact with the first and second faces 17a and 17b. The laser structure 17 includes a first region 17c, a second region 17d, and a third region 17e, which are arranged in the direction of the first axis Ax1. The third region 17e is disposed between the first and second regions 17c and 17d. The first region 17c includes the first end face 29, and the second region 17d may include the second end face 31.

The reflecting structure 23 is disposed on the laser structure 17. Specifically, the reflecting structure 23 is disposed on not the second end face 31 but the first end face 29. The reflecting structure 23 includes a metal film 33 and an insulating film 35.

The metal film 33 has a first edge 33a on the first face 17a of the first region 17c, and a second edge 33b on the second face 17b of the first region 17c. The metal film 33 extends continuously from the first edge 33a on the first electrode 19 to the second edge 33b on the second electrode 21 via the first end face 29.

The insulating film 35 has a first edge 35a on the first face 17a of the first region 17c, and a second edge 35b on the second face 17b of the first region 17c, and continues from the first edge 35a to the second edge 35b. The insulating film 35 is located between the laser structure 17 and the first and second edges 33a and 33b of the metal film 33.

The quantum cascade laser 13 can provide the optical cavity with the reflecting structure 23 on the laser structure 17. The reflecting structure 23 is provided with the metal and insulating films 33 and 35, and allows the insulating film 35 to be in contact with the first end face 29 and to be disposed between the laser structure 17 and the first and second edges 33a and 33b of the metal film 33. The metal film 33 has a major portion 33c on the first end face 29, and has a first portion 33d and a second portion 33e, which are disposed on the first and second faces 17a and 17b, respectively. Forming the first and second portions 33d and 33e so as to adjoin the major portion 33c can provide the major portion 33c of the metal film 33 with a desired thickness.

The insulating film 35 has a major portion 35c, which is in contact with the first end face 29, and has a first portion 35d and a second portion 35e, which are disposed on the first and second faces 17a and 17b of the first region 17c, respectively, which are connected to the major portion 35c. Forming the first and second portions 35d and 35e so as to adjoin to the major portion 35c can provide the major portion 35c with a desired thickness, thereby reliably preventing the metal film 33 from making contact with the first end face 29. The insulating film 35 is disposed on the first and second faces 17a and 17b and between the laser structure 17 and the first and second edges 33a and 35b to prevent the metal film 33 from covering the first and second edges 35a and 35b of the insulating film 35, and accordingly can separate the metal film 33 of the reflecting structure 23 from the first and second electrodes 19 and 21.

Referring again to FIG. 1, the submount 15 includes a base 15a and a conductive layer 15b on the base 15a. The base 15a has a mounting face 15c mounting the conductive layer 15b, and an end face 15d. The end face 15d has an upper edge 15f apart from the front edge 15e of the mounting face 15c. The front edge 15e of the mounting face 15c and the upper edge 15f of the end face 15d are arranged in the direction of the first axis Ax1.

The submount 15 supports the second region 17d of the laser structure 17 on the mounting face 15c, but does not support the third region 17e of the laser structure 17.

The light emitting apparatus 11 provides the submount 15 with the mounting face 15c apart from the upper edge 15f of the end face 15d, so that the submount 15 supports the second region 17d on the mounting face 15c, and does not support the third region 17e. This supporting can separate the metal film 33 of the reflecting structure 23 from the conductive layer 15b on the mounting face 15c.

The quantum cascade laser 13 is provided with the reflecting structure 23 for the resonator on the laser structure 17. The metal and insulating films 33 and 35 in the reflecting structure 23 may be disposed on each of the first and second faces 17a and 17b of the first region 17c.

Specifically, the reflecting structure 23 also provides the metal film 33 with the major portion 33c, the first portion 33d and the second portion 33e. The major portion 33c is disposed on the first end face 29, and the first and second portions 33d and 33e are disposed on the first and second faces 17a and 17b of the first region 17c, respectively, and adjoin the major portion 33c therebetween. Forming the first and second portions 33d and 33e that adjoin the major portion 33c can provide the major portion 33c with a desired thickness. The insulating film 35 is disposed on the first end face 29 and between the laser structure 17 and the first and second edges 33a and 33b of the metal film 33. Specifically, the insulating film 35 is provided with the major portion 35c, the first portion 35d, and the second portion 35e. The major portion 35c is disposed on the first end face 29 and is in contact with the first end face 29, and the first and second portions 35d and 35e are in contact with the first and second faces 17a and 17b of the first region 17 c and adjoin the major portion 35c therebetween. Forming the first and second portions 35d and 35e that adjoin the major portion 35c can provide the major portion 35c with a desired thickness, and can also provide the first and second portions 35d and 35e as well as the major portion 35c with respective desired thicknesses, thereby reliably preventing the metal film 33 from making contact with the first end face 29.

Furthermore, on the first and second faces 17a and 17b, the insulating film 35 is disposed between the laser structure 17 and the first and second edges 33a and 33b of the metal film 33 to prevent the metal film 33 from reaching and covering the first and second edges 35a and 35b of the insulating film 35, thereby reliably separating the metal film 33 from the first and second electrodes 19 and 21 of the quantum cascade laser 13.

The insulating film 35 may include at least one of $SiO_2$, SiON, SiN, alumina, benzocyclobutene (BCB), or polyimide. The light emitting apparatus 11 can use the insulating film 35 including these insulating materials. These insulators can provide the insulating film 35 with excellent durability and insulation. These dielectric films can be easily formed by a method for forming a film, such as sputtering, CVD, and spin coating.

The metal film 33 may include gold. The light emitting apparatus 11 can include the metal film 33 of gold. The gold film can be formed, for example, by vapor deposition.

The light emitting apparatus 11 may further include a solder material 37, which can fix the second electrode 21 of the quantum cascade laser 13 to the conductive layer 15b of the submount 15. The light emitting apparatus 11 can separate the solder material 37 on the conductive layer 15b from the reflecting structure 23.

The submount 15 has a base 15a, which may include at least one of AlN, CuW, CuMo, or diamond. The light emitting apparatus 11 can use the submount 15 including the above-mentioned submount material. If necessary, the submount 15 may have an insulating film on the conductive base 15a, and the insulating film provides the mounting top face 15c with an insulating property. The solder material 37 may include at least one of AuSn, Sn, SnPb, AgSn, In, or silver paste. The light emitting apparatus 11 can use the above-described solder material.

The light emitting apparatus 11 may further include a carrier 39, which can mount the submount 15. The submount 15 may be die-bonded to the carrier 39. The carrier 39 can include any one of Cu, CuW, Fe alloy, and brass. The light emitting apparatus 11 can use the above-described carrier material.

Referring to FIGS. 2, 3A and 3B, in the quantum cascade laser 13, the waveguide mesa 25 includes a core layer 25a, a lower cladding layer 25b, and an upper cladding layer 25c, and may further include a contact layer 25d. The quantum cascade laser 13 can have a Fabry-Perot type. Alternatively, the quantum cascade laser 13 can have a distributed feedback type and includes a diffraction grating layer 25e. The diffraction grating layer 25e has a periodic structure that defines the lasing wavelength of the quantum cascade laser 13. In the present embodiment, the waveguide mesa 25 includes the lower cladding layer 25b, the core layer 25a, the diffraction grating layer 25e, the upper cladding layer 25c, and the contact layer 25d, which are sequentially arranged on the principal surface 27a of the substrate 27. The quantum cascade laser 13 may include a semiconductor embedding region 26 that embeds the sides of the waveguide mesa 25 and works as a current blocking layer, and the semiconductor embedding region 26 may be formed of undoped and/or semi-insulating semiconductor. The first electrode 19 is disposed on the semiconductor embedding region 26 and the waveguide mesa 25, and the second electrode 21 is disposed on the back face 27b of the substrate 27. The substrate 27 may include, for example, a conductive semiconductor substrate.

In the present embodiment, the light emitting apparatus 11 may have, on the second end face 31, a protective film or an end face film 38 which enables end face reflectance control, and can emit a laser light beam L therethrough. Alternatively, the light emitting apparatus 11 can emit the laser light beam L directly from the second end face 31 which is not provided with the end face film 38.

In the reflecting structure 23, as shown in FIG. 4A, the metal film 33 has a thickness T33U at the first edge 33a, and the thickness T33U is, for example, 10 nm or more. The insulating film 35 has a thickness T35U at the first edge 35a, and the thickness T35U is, for example, 20 nm or more. The upper interval EXTU between the first edge 33a of the metal film 33 and the first edge 35a of the insulating film 35 is, for example, 10 to 100 nm.

As shown in FIG. 4B, the metal film 33 has a thickness T33D at the second edge 33b, and the thickness T33D is, for example, 10 nm or more. The insulating film 35 has a thickness T35D at the second edge 35b, and the thickness T35D is, for example, 20 nm or more. The lower interval EXTD between the second edge 33b of the metal film 33 and the second edge 35b of the insulating film 35 is in a range of, for example, 10 to 100 nm.

In the reflecting structure 23, the metal film 33 has a thickness T33F on the first end face 29, and the thickness T33F is in a range of, for example, 50 to 200 nm. The sufficiently large thicknesses T33U and T33D allow the metal film 33 to have a desired thickness T33F on the first end face 29. The insulating film 35 has a thickness T35F on the first end face 29, and the thickness T35F is in a range of, for example, 100 to 300 nm. The sufficiently large thicknesses T35U and T35D can provide a desired thickness T35F on the first end face 29.

A method for fabricating the quantum cascade laser 13 will be described with reference to FIGS. 5A to 8B. For easily understanding, where possible, reference numerals for the quantum cascade laser 13 will be used in the following description on the fabricating method.

Figure 5A:
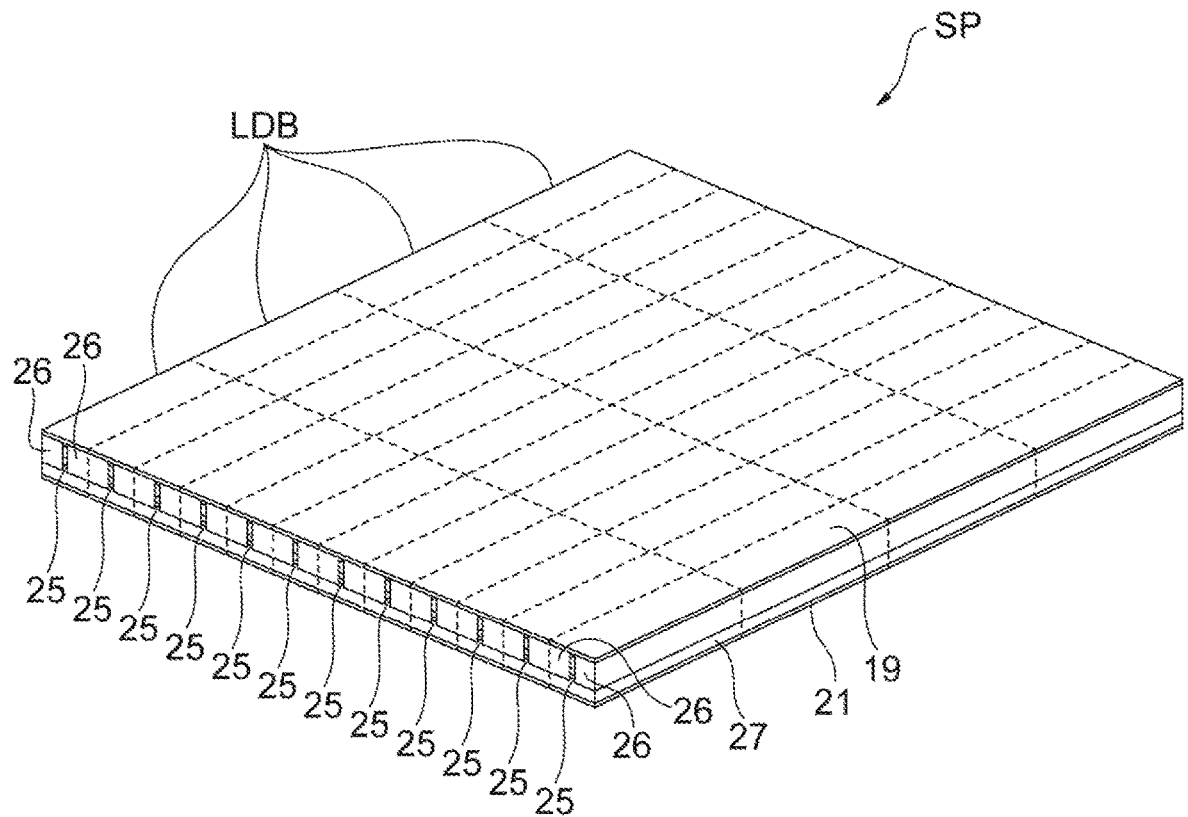
FIG. 5A is a schematic view showing a major step in a method for fabricating a quantum cascade laser according to the embodiment.
Figure 5B:
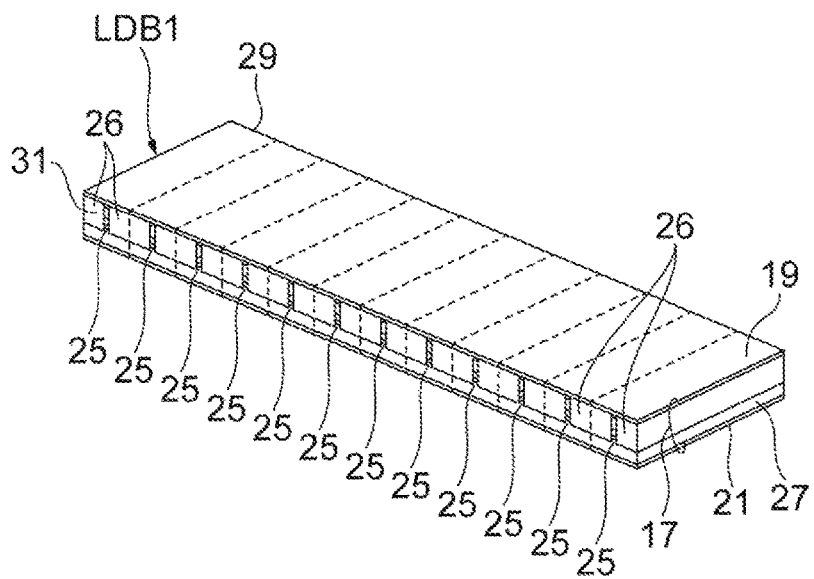
FIG. 5B is a schematic view showing a major step in the method according to the embodiment.

As shown in FIG. 5A, a substrate product SP is prepared. In the present embodiment, the substrate product SP includes a support (the substrate 27), multiple waveguide mesas 25 that extend on the support, a semiconductor embedding region 26 that embeds the waveguide mesas 25, and upper electrode layers (for the first electrode 19) and a continuous film for lower electrodes (for the second electrode 21). The substrate product SP includes an array of device sections, which can provide four laser bar LDBs. The substrate product SP is made using a semiconductor processes, such as crystal growth, photolithography, etching, regrowth, and is produced from a wafer product.

As shown in FIG. 5A, the substrate product SP is divided into laser bars LDB1 by cleavage. Each laser bar LDB1 has a one-dimensional array including, for example, twelve device sections.

Figure 6A:
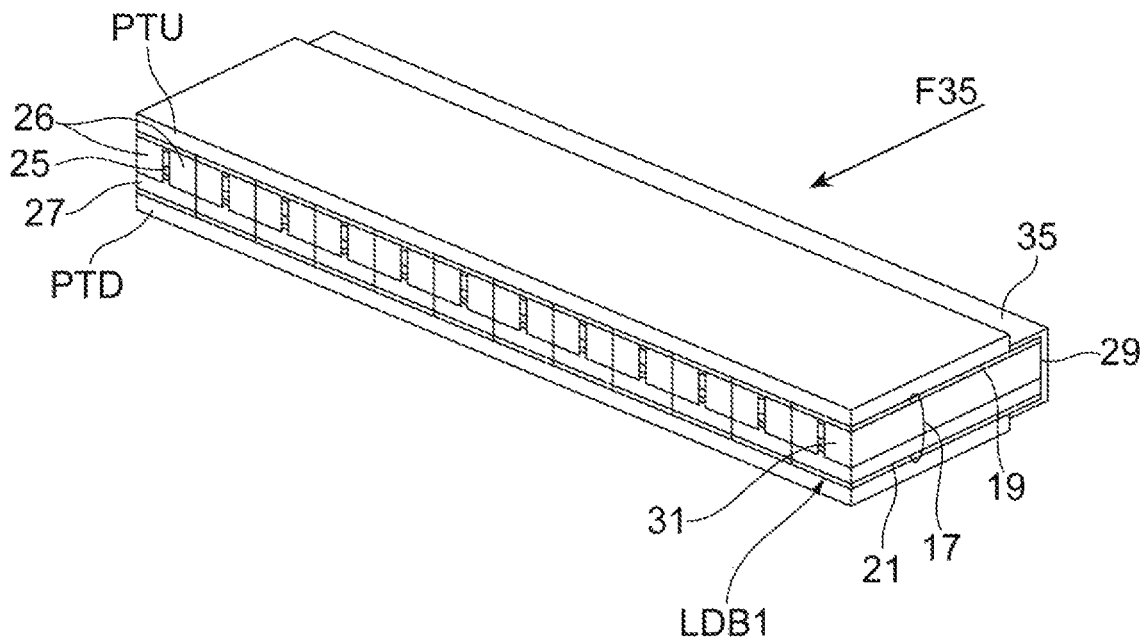
FIG. 6A is a schematic view showing a major step in the method according to the embodiment.

As shown in FIG. 6A, deposition for the insulating film 35 is applied to the first end face 29. In order to position the first and second edges 35a and 35b on the laser bar, an upper protector PTU and a lower protector PTD are used. The upper and lower protectors PTU and PTD are positioned to the laser bar LDB1 so as to cover the first and second electrodes 19 and 21 and so as not to cover the first region of the laser structure 17 with the upper and lower protectors PTU and PTD. The upper and lower protectors PTU and PTD covers neither the first end face 29 of the laser bar LDB1 nor the first and second electrodes 19 and 21 in the first region 17c of the laser structure 17. After the upper and lower protectors PTU and PTD are attached to the laser bar LDB1, flux F35 for the insulating film 35 is supplied to the first end face 29 of the laser structure 17 to form deposited materials of the insulating film 35. The insulating film 35 thus deposited is disposed on not only the first end face 29 but also the first and second electrodes 19 and 21 on the first region 17c.

Figure 6B:
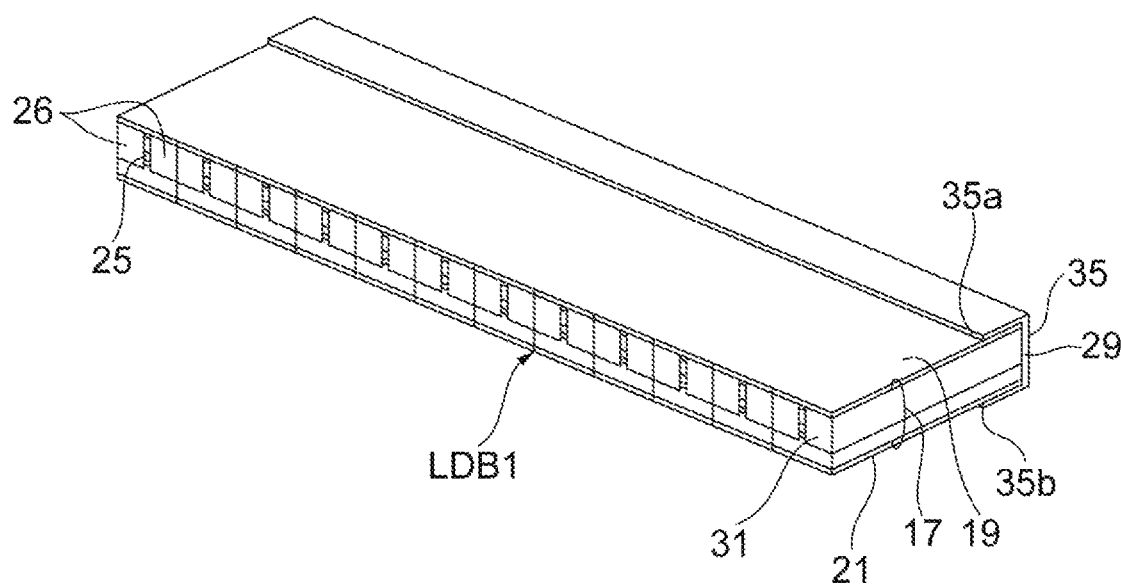
FIG. 6B is a schematic view showing a major step in the method according to the embodiment.

As shown in the of FIG. 6B, the upper and lower protectors PTU and PTD are removed from the laser bar LDB1 to obtain the laser bar LDB that includes the insulating film 35 with the first and second edges 35a and 35b located at respective desired positions.

Figure 7A:
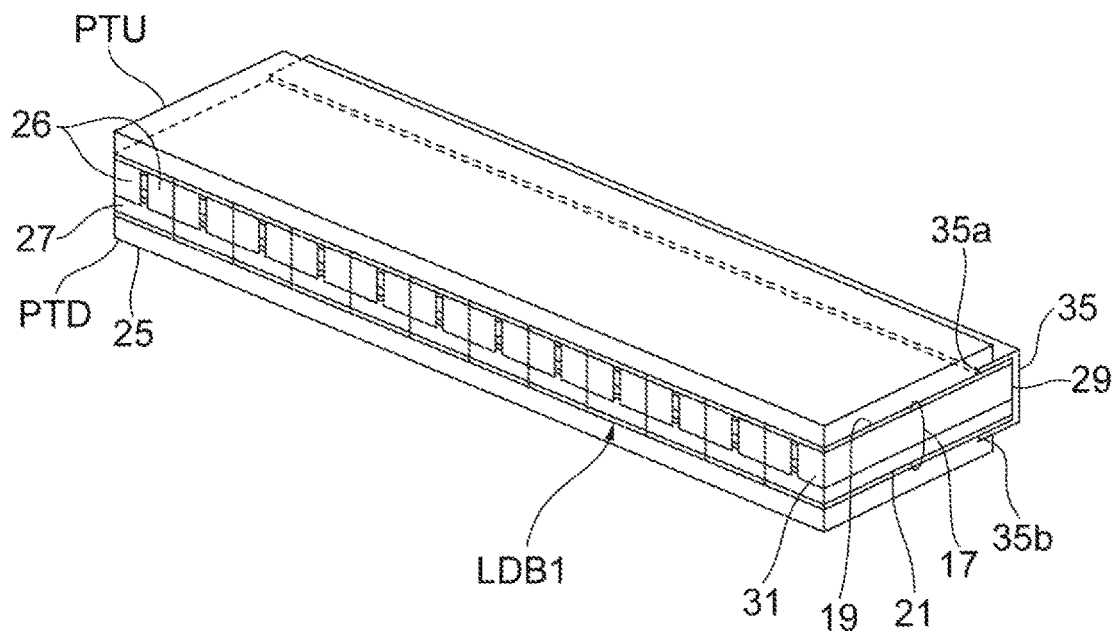
FIG. 7A is a schematic view showing a major step in the method according to the embodiment.
Figure 7B:
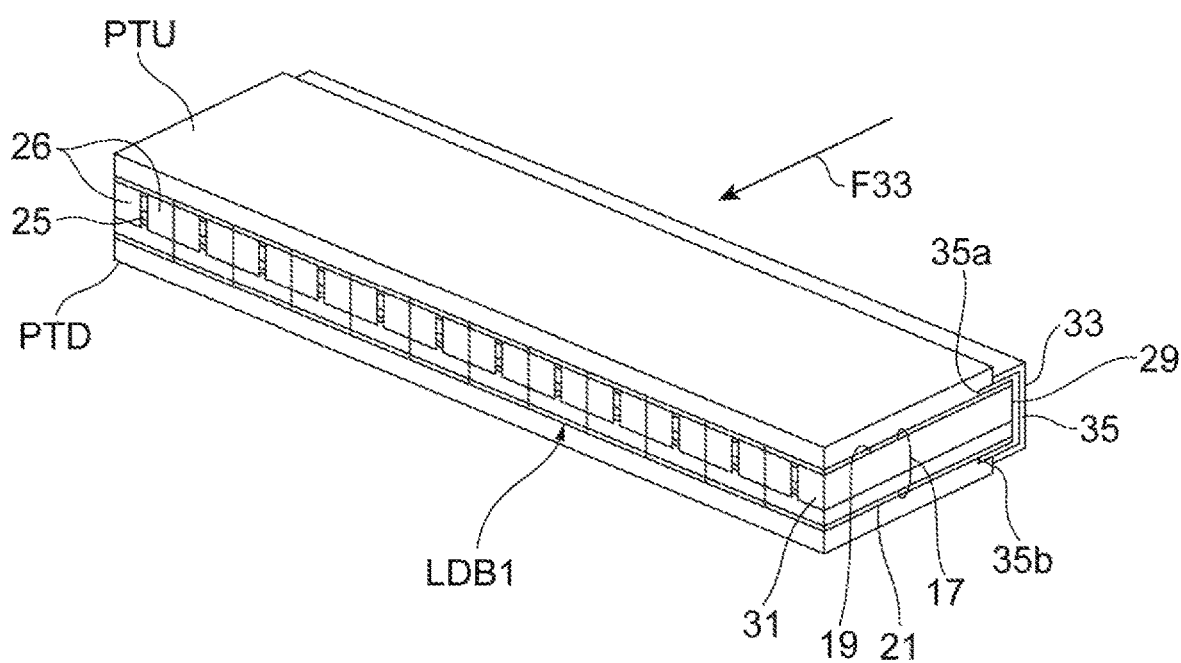
FIG. 7B is a schematic view showing a major step in the method according to the embodiment.

As shown in FIG. 7A, the application of the next deposition process to the first end face 29 forms the metal film 33 thereon. In order to provide the insulating film 35 with the first and second edge 33a and 33b, the upper and lower protectors PTU and PTD is used. The upper and lower protectors PTU and PTD are aligned with the laser bar LDB1 so as to cover desired parts of the first and second portions 35d and 35e provided with first and second edge 35a and 35b on the laser bar LDB1, respectively, so that covering ends of the insulating film 35 and the first and second electrode 19 and 21 with the upper and lower protectors PTU and PTD prevents metal for the metal film 33 from depositing on the ends of the insulating film 35. But, the upper and lower protectors PTU and PTD are aligned not to cover the insulating film 35 on the first end face 29 and parts of the insulating film 35 on the first region of the laser structure 17, and these parts of the insulating film 35 exclude the first edges 35a and 35b on the first and second electrode 19 and 21.

As shown in FIG. 7A, after the upper and lower protectors PTU and PTD are again installed to the laser bar LDB1, flux F33 for the metal film 33 is supplied to the first end face 29 of the laser structure 17 to form the deposited materials of the metal film 33. The metal film 33 thus deposited is disposed not only on the first end face 29 but also the first and second faces 17a and 17b of the first region 17c.

Figure 8A:
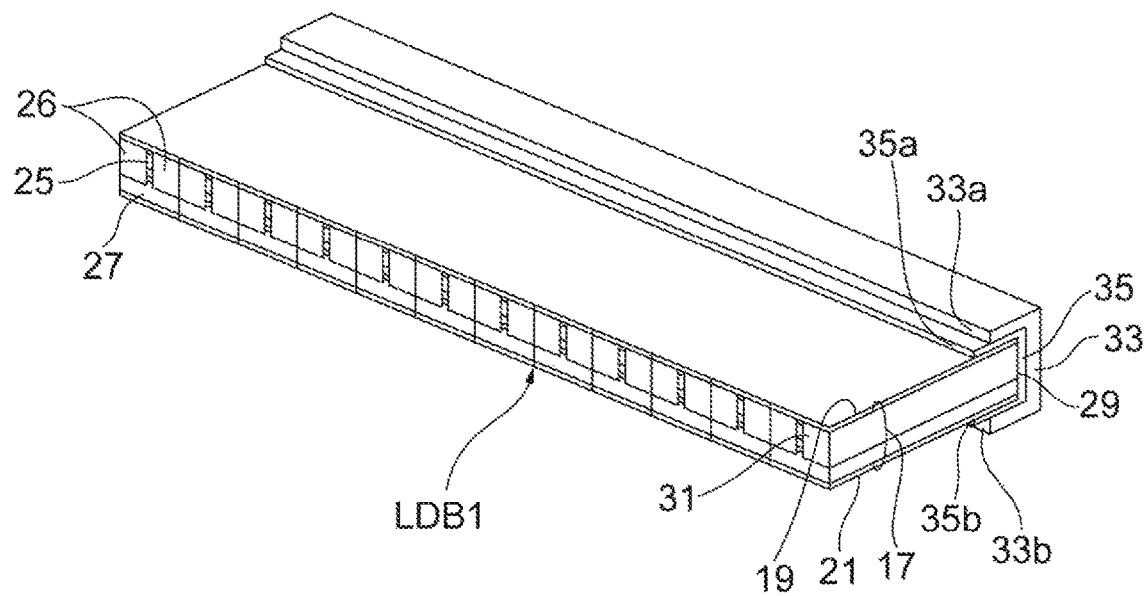
FIG. 8A is a schematic view showing a major step in the method according to the embodiment.

As shown in FIG. 8A, the upper and lower protectors PTU and PTD are removed from the laser bar LDB1 to obtain the laser bar LDB1 that includes the metal film 33 having first and second edges 33a and 33b on the insulating film 35 at respective desired positions.

Figure 8B:
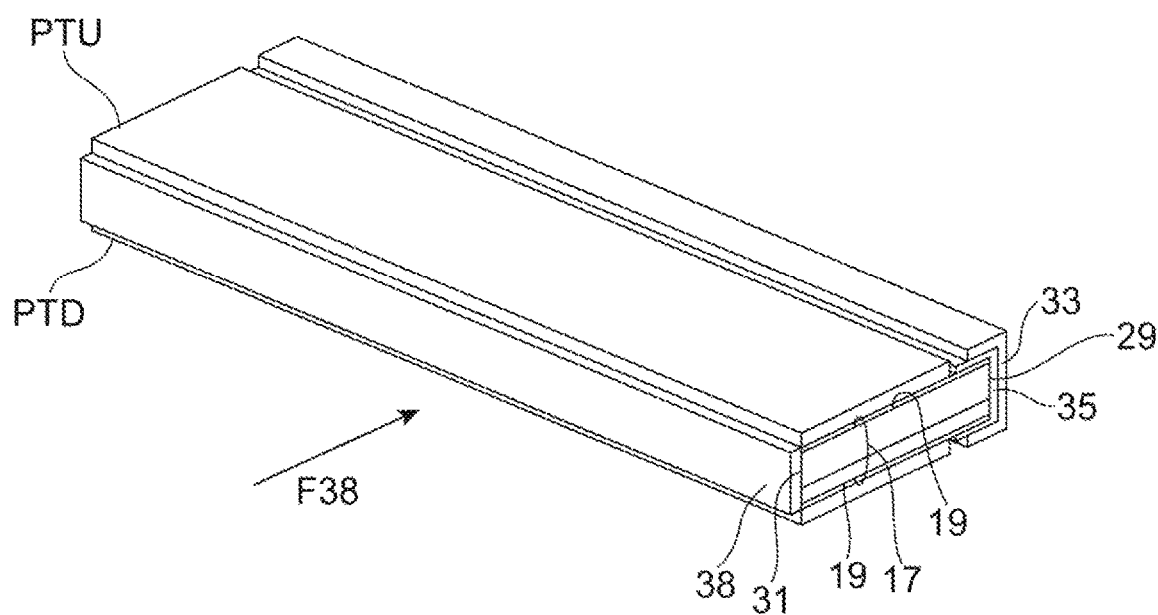
FIG. 8B is a schematic view showing a major step in the method according to the embodiment.

If necessary, as shown in FIG. 8B, the application of a deposition process to the second end face 31 forms the end face film 38 thereon. After attaching the upper and lower protectors PTU and PTD to the laser bar LDB1, flux F38 is supplied to the second end face 31 of the laser structure 17 to form the deposited material of the end face film 38. Thereafter, the upper and lower protectors PTU and PTD are removed from the laser bar LDB1 to obtain the laser bar LDB1 that has the insulating and metal films 35 and 33 thereon. The laser bar LDB1 is divided at the boundaries of the device sections into semiconductor chips, i.e., the quantum cascade lasers 13, each including the reflecting structure 23.

Example 1

The quantum cascade laser 13 according to the first embodiment will be described with reference to FIGS. 9 and 10. FIG. 9 is a cross-sectional view taken along the line IX-IX of FIG. 10. The substrate 27 is conductive and may include, for example, an n-type InP substrate. The semiconductor layers of the quantum cascade laser that emits mid-infrared lasing light each have a semiconductor material of a lattice constant matched or close to that of InP. The semiconductor substrate of InP can provide these semiconductor layers with their excellent crystal quality. InP can transmit mid-infrared light, and this InP substrate can work as a lower cladding region. The semiconductor substrate is used for crystal growth, such as molecular beam epitaxy and organometallic vapor phase epitaxy.

The lower and lower cladding layers 25b and 25c may include n-InP, which is transparent to mid-infrared light. The lower and upper cladding layers 25b and 25c of InP are lattice-matched to the InP substrate. InP is a binary mixed crystal, which enables excellent crystal growth on the InP substrate. Furthermore, InP has the largest thermal conductivity among the semiconductor materials usable for mid-infrared quantum cascade lasers to enable the cladding layers of InP to radiate heat from the core layer 25a, thereby bringing the quantum cascade laser improved temperature characteristics.

The core layer 25a has a stack of unit structures, each of which includes an active layer and an injection layer, and specifically, the active layers and injection layers are alternately arranged to form multiple stages. Each of the active and injection layers includes a superlattice structure, which has multiple quantum well layers and multiple barrier layers, which are alternately stacked. Each quantum well layer is a thin film with a thickness of several nanometers, and each barrier layer is a thin film with several nanometers and has a bandgap higher than that of the quantum well layer. Quantum cascade lasers use a single kind of carriers, for example electrons, in the active layer of a subband structure having the upper and lower levels of the conduction band which allows the intersubband transition to emit mid-infrared light, and amplify the light thus emitted in the optical cavity. As seen from the above description, the intersubband transition can emit mid-infrared wavelength light. The core layer 25a includes a superlattice structure, and electrons which have transitioned to produce photo emission by the intersubband transition in the conduction band of the upstream active layer flows into the injection layer, and the injection layer can inject electrons thus transitioned smoothly into the downstream active layer. In the downstream active layer, the electrons thus injected transition to produce photo emission by the intersubband transition. The alternating procedures of the transition and the injection allow the quantum cascade laser to lase. The quantum well layer can includes, for example, GaInAs and GaInAsP, and the barrier layer can include AlInAs. The active layer of the superlattice structure that provides the quantum well and barrier layers with these materials allows the unit structure to have an energy difference between the upper and lower levels that enables an optical transition in mid-infrared wavelengths of, for example, 3 to 20 micrometers.

If needed, the quantum cascade laser is provided with the contact layer 25d. The contact layer 25d is made of material, which is lattice-matched to the InP substrate, with a small bandgap enabling an excellent ohmic contact to the first electrode 19, and may include, for example, n-GaInAs.

The diffraction grating layer 25e provides the quantum cascade laser 13a with a distributed feedback structure. The diffraction grating layer 25e has a diffraction grating structure, which is formed by etching, extending in the direction of the first axis Ax1. The diffraction grating structure enables single mode oscillation at Bragg wavelength associated with to the period P. The diffraction grating layer 25e may include a high refractive index semiconductor, for example, undoped or n-type GaInAs, which can provide the diffraction grating layer 25e with a large coupling coefficient.

The semiconductor embedding region 26 provides the quantum cascade laser 13 with a buried hetero structure. The semiconductor embedding region 26 works as a current blocking layer including an undoped or semi-insulating semiconductor of high resistance, and confines carriers into the waveguide mesa 25. The semi-insulating semiconductor is formed by doping a III-V compound semiconductor with a transition metal, such as Fe, Ti, Cr or Co, and in particular, Fe is used as the dopant. The addition of the transition metal to a host semiconductor allows semi-insulating semiconductor to have a high resistance of, for example, $10^5$ ($\Omega$cm) or more to electrons. If possible, the current blocking layer can use undoped III-V compound semiconductor instead of the semi-insulating semiconductor. The undoped or semi-insulating semiconductor embedding layer is produced from a host compound semiconductor, such as InP, GaInAs, AlInAs, GaInAsP, and AlGaInAs. These semiconductors are lattice-matched to InP.

The first and second electrodes 19 and 21 may include, for example, Ti/Au, Ti/Pt/Au, or Ge/Au.

If needed, the quantum cascade laser 13 is provided with a light confinement region, which can be provided above or below the core layer 25a, or both to enhance optical confinement of propagating light into the core layer 25a. The optical confinement region may include a semiconductor, lattice-matched to InP, of a high refractive index and, for example, undoped or n-type GaInAs.

Doping semiconductor with an n-type dopant, such as Si, S, Sn and Se can provide the semiconductor with an n-type conductivity.

The quantum cascade laser 13 can be provided with a high mesa structure, which includes a dielectric insulating film covering the sides of the waveguide mesa 25 without the semiconductor embedding region 26. The dielectric insulating film works as a current confinement structure, and can be provided with a silicon-based inorganic insulating film, such as $SiO_2$, SiON, or SiN.

Figure 10:
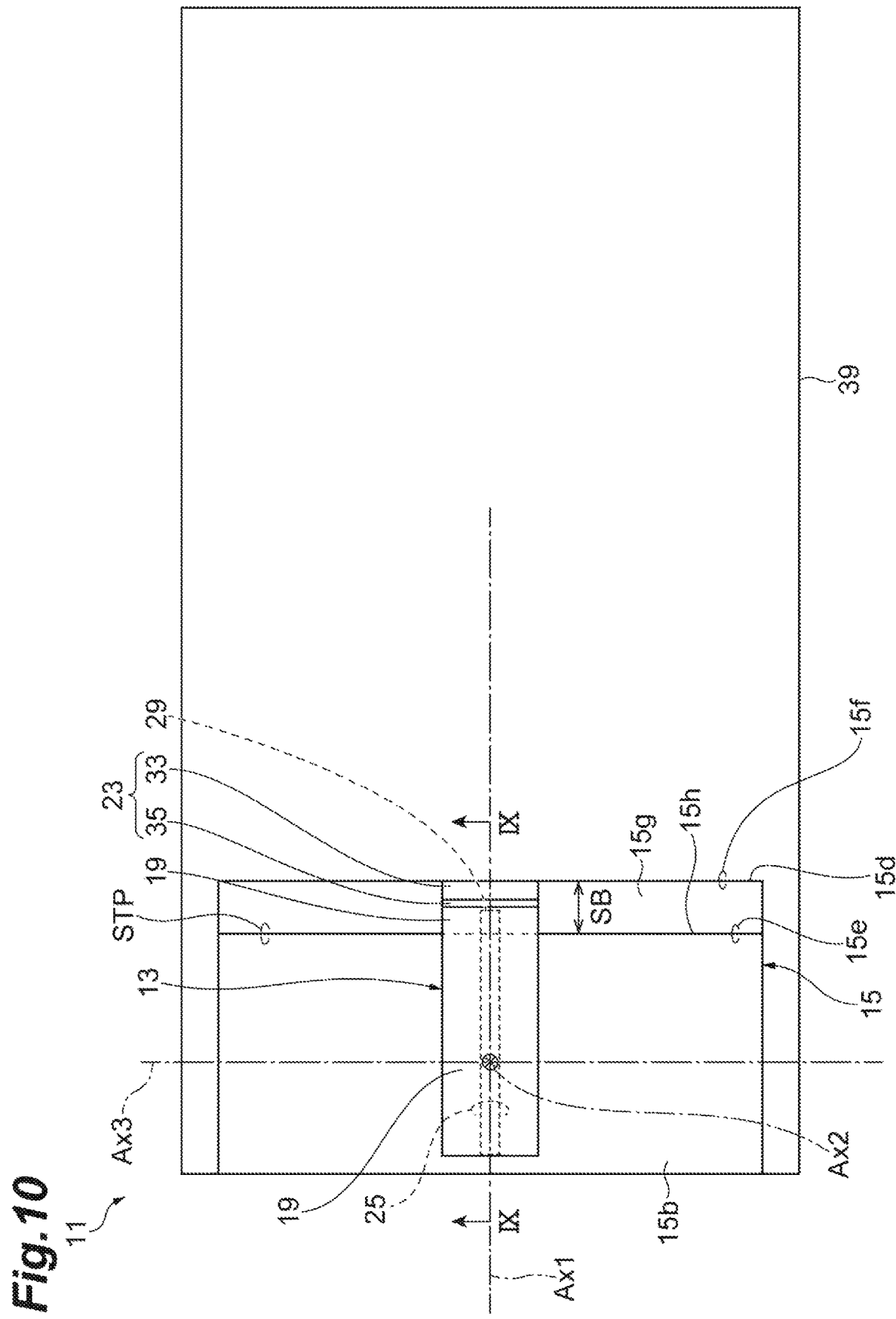
FIG. 10 is a schematic plan view showing the light emitting apparatus and a quantum cascade laser according to Example 1.

With reference to FIGS. 9 and 10, a light emitting apparatus according to Example 1 will be described. The quantum cascade laser 13 is positioned on the conductive layer 15b of the submount 15 to the end face 15d (a marker) of the submount 15, so that the rear end thereof at which the quantum cascade laser 13 has the reflecting structure 23 is aligned with the marker in the direction of the first axis Ax1. The front edge 15e is set back with respect to the end face 15d by an amount of SB, for example, 100 to 200 nm.

In order to provide the insulating film 35 and the metal film 33 with respective sufficient thicknesses on the first and second electrodes 19 and 21, the length of the first region 17c, i.e., the first length L1 is, for example, 100 nm or less, and in order to provide the insulating film 35 and the metal film 33 with desired coatings on the first and second electrodes 19 and 21, the first length L1 can be, for example, 20 nm or more.

In the submount 15, the mounting face 15c is provided with the front edge 15e that is set back with respect to the upper edge 15f of the end face 15d by the amount SB, thereby forming a recess between the end face 15d and the front edge 15e. In the present embodiment, the submount 15 has a stepped portion STP with a difference in level at the front edge 15e of the mounting face 15c, and a recessed face 15g extending from the upper edge 15f of the end face 15d to the lower end of the step STP in the direction of the first axis Ax1. The stepped portion STP has a side end face 15h extending from the mounting face 15c to the recessed face 15g. This submount 15 can separate the reflecting structure 23 of the quantum cascade laser 13 away from the recessed face 15g.

The light emitting apparatus 11 provides the submount 15 with the recessed face 15g, which extends from the side end face 15h of the stepped portion STP at the front edge 15e to the upper edge 15f of the end face 15d in the direction of the first axis Ax1, and the submount 15 can separate the reflecting structure 23 of the quantum cascade laser 13 from the conductive layer 15b thereof. In order to enable reliable insulation, the interval (the width of the third region 17e) between the second edges (e.g., the second edges 33b and 35b) of the reflecting structure 23 and the end of the solder material 37 bonded with the second electrode 21 can be, for example, 10 nm or more, and this interval can be, for example, 100 nm or less, thereby providing an appropriate carrier path, a bonding strength between the submount 15 and the quantum cascade laser 13, and/or a heat dissipation path in the submount.

The submount 15 may be provided with either a sloping surface extending from the front edge 15e of the mounting face 15c to the upper edge 15f of the end face 15d or the stepped portion STP, which is defined by the recessed face 15g and the side end face 15h.

Example 2

Figure 11:
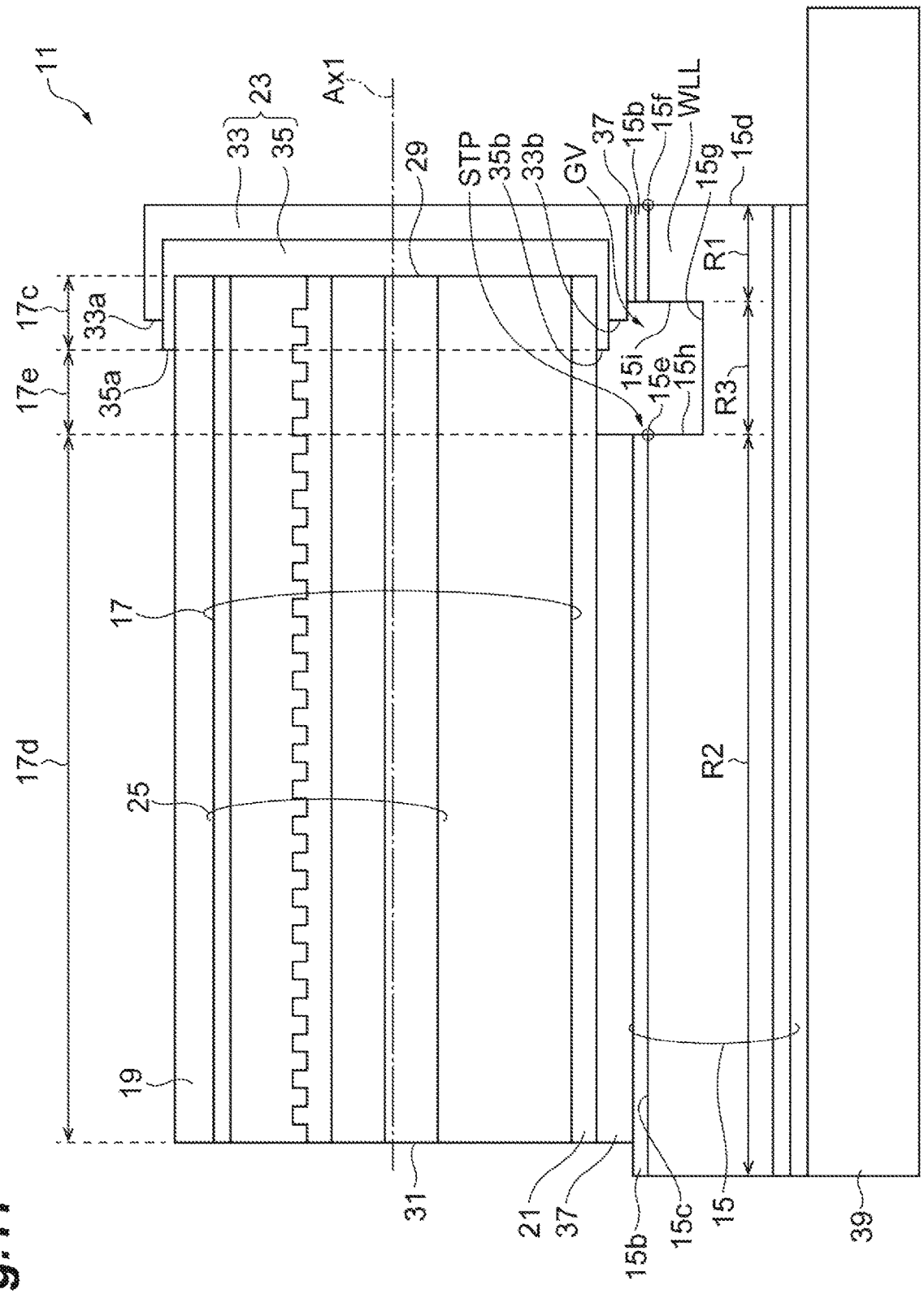
FIG. 11 is a cross-sectional view showing a light emitting apparatus and a quantum cascade laser according to Example 2.
Figure 12:
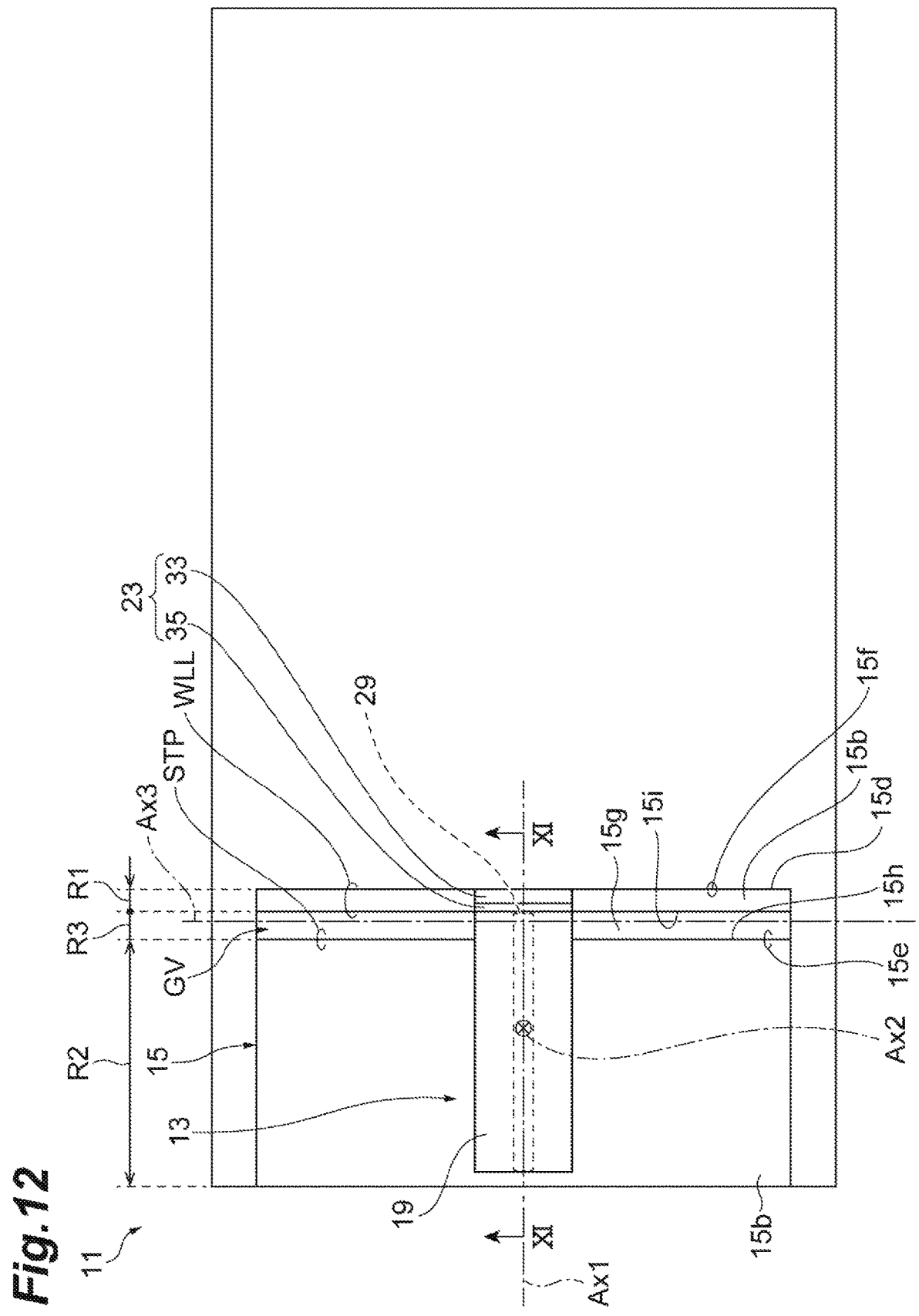
FIG. 12 is a schematic plan view showing the light emitting apparatus and the quantum cascade laser according to Example 2.

With reference to FIGS. 11 and 12, a light emitting apparatus according to a second embodiment will be described below. FIG. 11 is a cross-sectional view taken along line XI-XI shown in FIG. 12. In the light emitting apparatus 11 according to the second embodiment, the submount 15 has a groove GV which extends in the direction of the third axis Ax3 intersecting the first and second axes Ax1 and Ax2 and terminates the mounting face 15c. The groove GV is defined by the step STP that terminates the mounting face 15c and a wall portion WLL that extends in the direction of the third axis Ax3. Specifically, the groove GV is defined by the side face 15h, the recessed face 15g, and the wall side face 15i. In the present embodiment, the wall portion WLL forms the end face 15d.

The submount 15 includes a first region R1, a second region R2, and a third region R3, which are arranged in the direction of the first axis Ax1, and the third region R3 is disposed between the first and second regions R1 and R2. The first region R1 is provided with the end face 15d; the second region R2 includes a mounting face 15c; and the third region R3 includes a groove GV. The first and second regions R1 and R2 of the submount 15 support the quantum cascade laser 13, and the third region R3 does not support the quantum cascade laser 13.

The light emitting apparatus 11 can provide the submount 15 with the groove GV enabling the first and second regions R1 and R2 of the submount 15 to support the quantum cascade laser 13. Supporting the quantum cascade laser 13 in the first region R1 provides the core layer 25a in the vicinity of the first end face 29 with a heat dissipation path. Supporting the quantum cascade laser 13 in the first region R1 can also improve the mechanical strength for the quantum cascade laser 13 in the vicinity of the first end face 29, thereby enhancing the durability of the quantum cascade laser 13 against jar, such as vibrancy and fall. The submount is provided with the groove GV in the third region R3, and does not support the quantum cascade laser in the third region R3, which separates the solder material 37 on the conductive layer 15b. Specifically, the solder material 37 makes contact with the metal film 33 on the first region R1, and is insulated from the second electrode 21 by the insulating film 35. The solder material 37 causes the conductive layer 15b of the submount 15 to make contact with the second electrode 21 on the second region R2.

The quantum cascade laser 13 is provided with the rear end, which mounts the reflecting structure 23, aligned with the end face 15d (a marker) of the submount 15 in the direction of the first axis Ax1, so that the quantum cascade laser 13 is positioned to the conductive layer 15b.

Example 3

Figure 13:
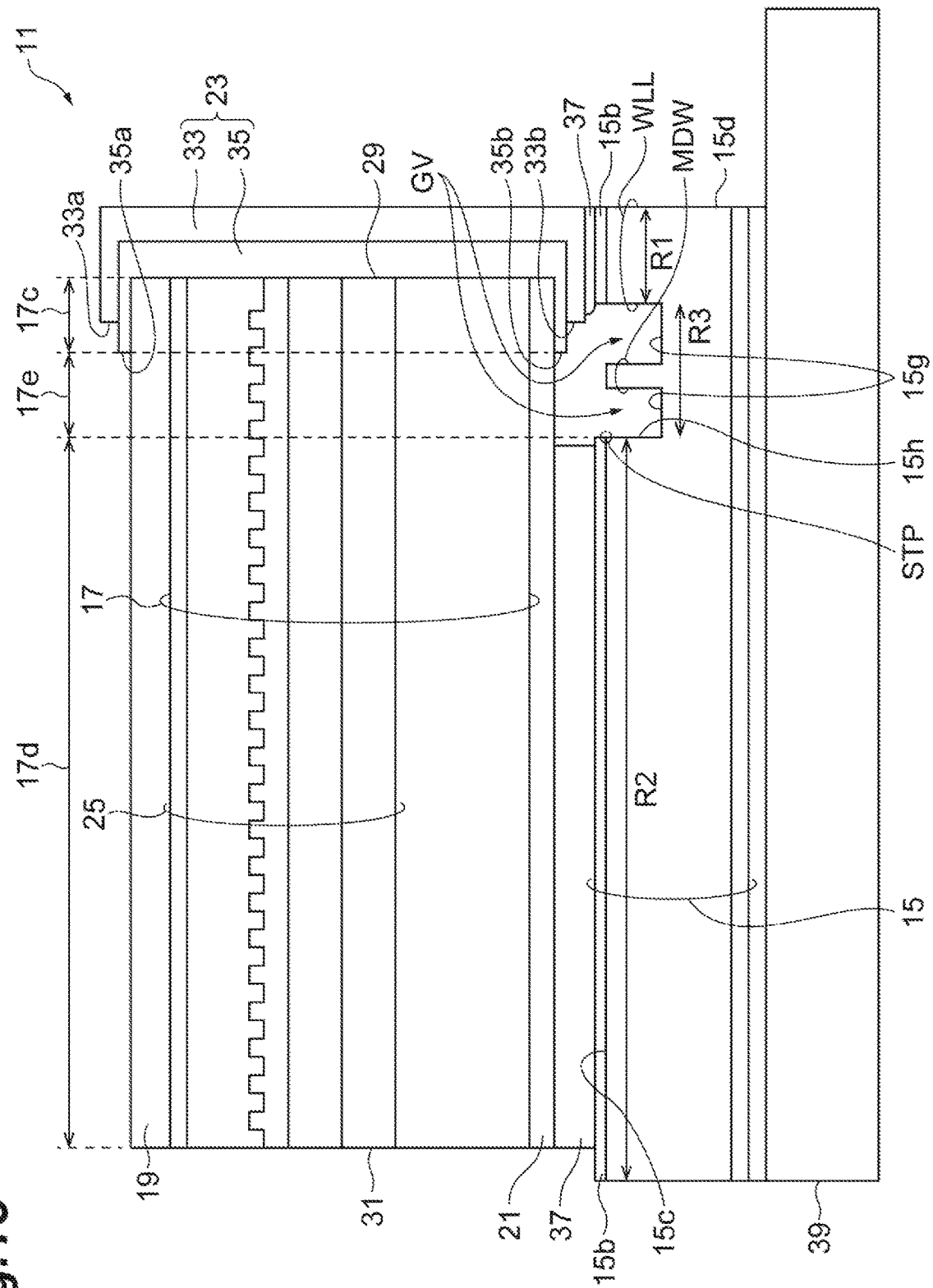
FIG. 13 is a cross-sectional view showing a light emitting apparatus and a quantum cascade laser according to Example 3.
Figure 14:
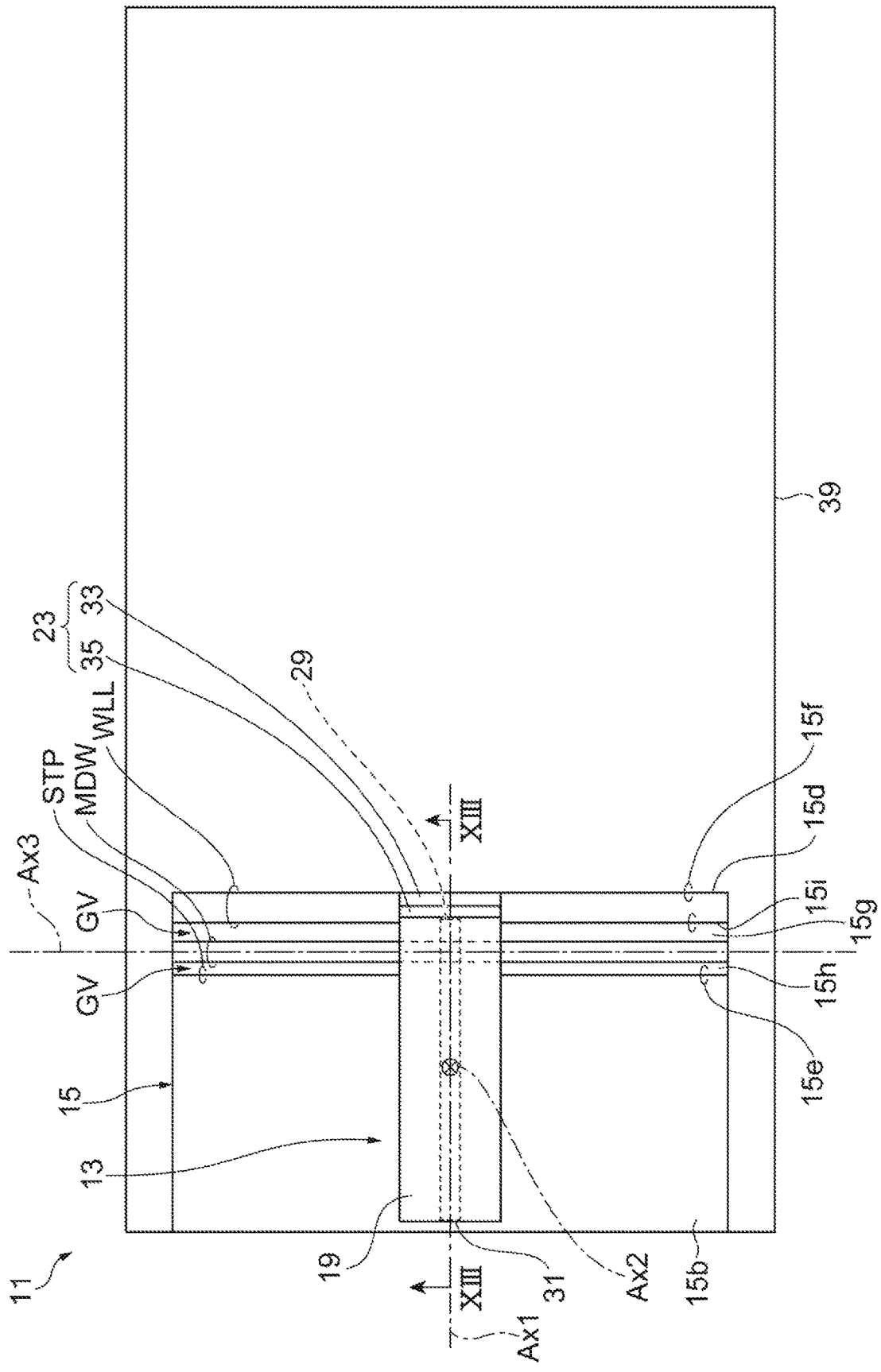
FIG. 14 is a schematic plan view showing the light emitting apparatus and the quantum cascade laser according to Example 3.

A light emitting apparatus according to a third embodiment will be described with reference to FIGS. 13 and 14. FIG. 13 is a cross-sectional view taken along the line XIII-XIII shown in FIG. 14. The light emitting apparatus 11 according to the third embodiment provides the submount 15 with the groove GV, which extends in the direction of the third axis Ax3 and terminates the mounting face 15c. The groove GV has one or more portioning walls MDW. The portioning walls MDW each extend in the direction of the third axis Ax3 and do not support the quantum cascade laser 13. The conductive layer 15b of the submount 15 is not disposed on the upper face of the portioning walls MDW. The portioning walls MDW can prevent the solder material 37 on the first and second regions R1 and R2 of the submount 15 from accidentally bridging the groove GV. The first and second regions R1 and R2 can provide the quantum cascade laser 13 with respective dissipation paths passing through the solder material 37.

The quantum cascade laser 13 is positioned on the conductive layer 15b to the end face 15d (a marker) of the submount 15 at the rear end thereof, which is provided with the reflecting structure 23, in the direction of the first axis Ax1.

Example 4

Figure 15:
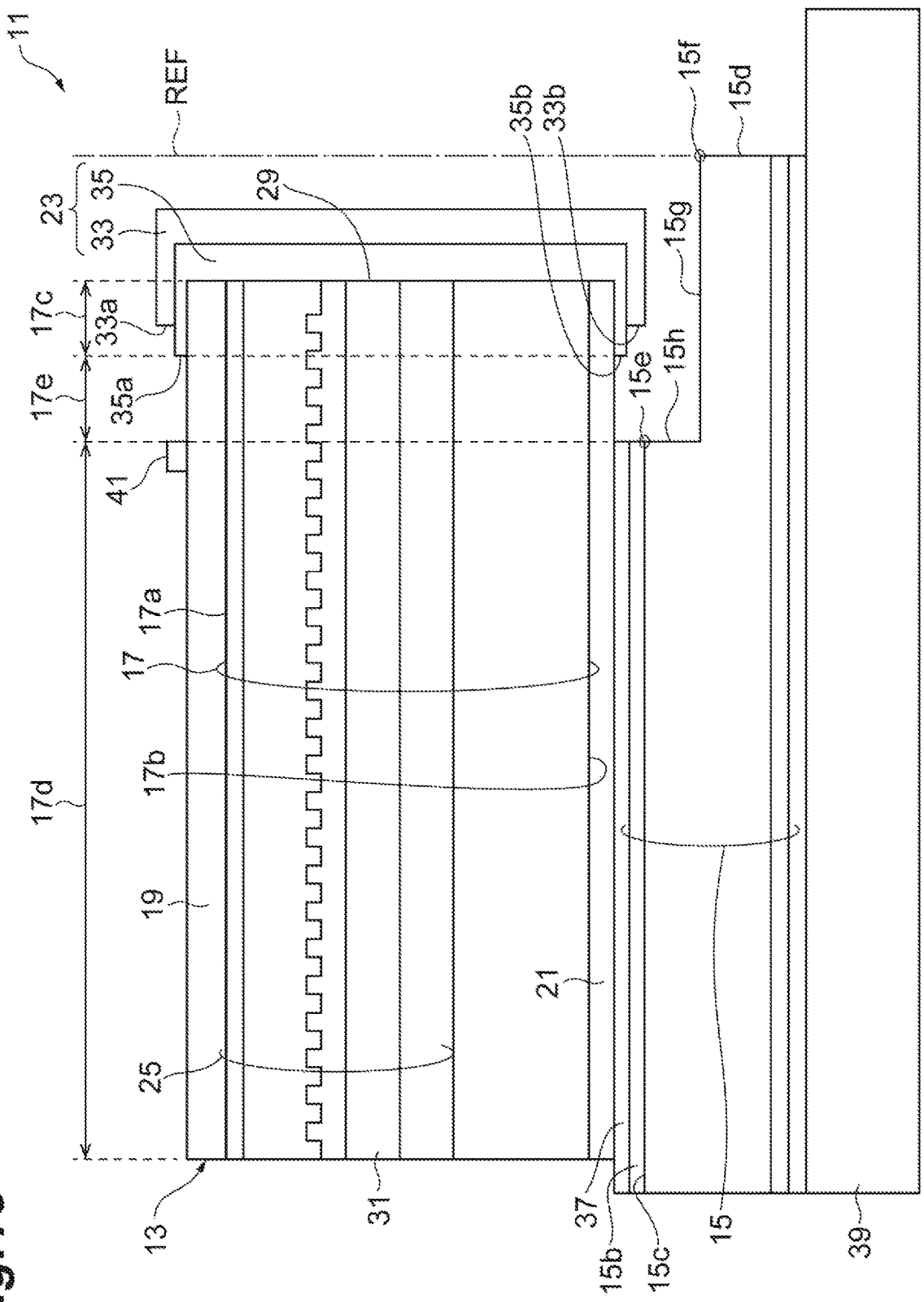
FIG. 15 is a cross-sectional view showing a light emitting apparatus and a quantum cascade laser according to Example 4.
Figure 16:
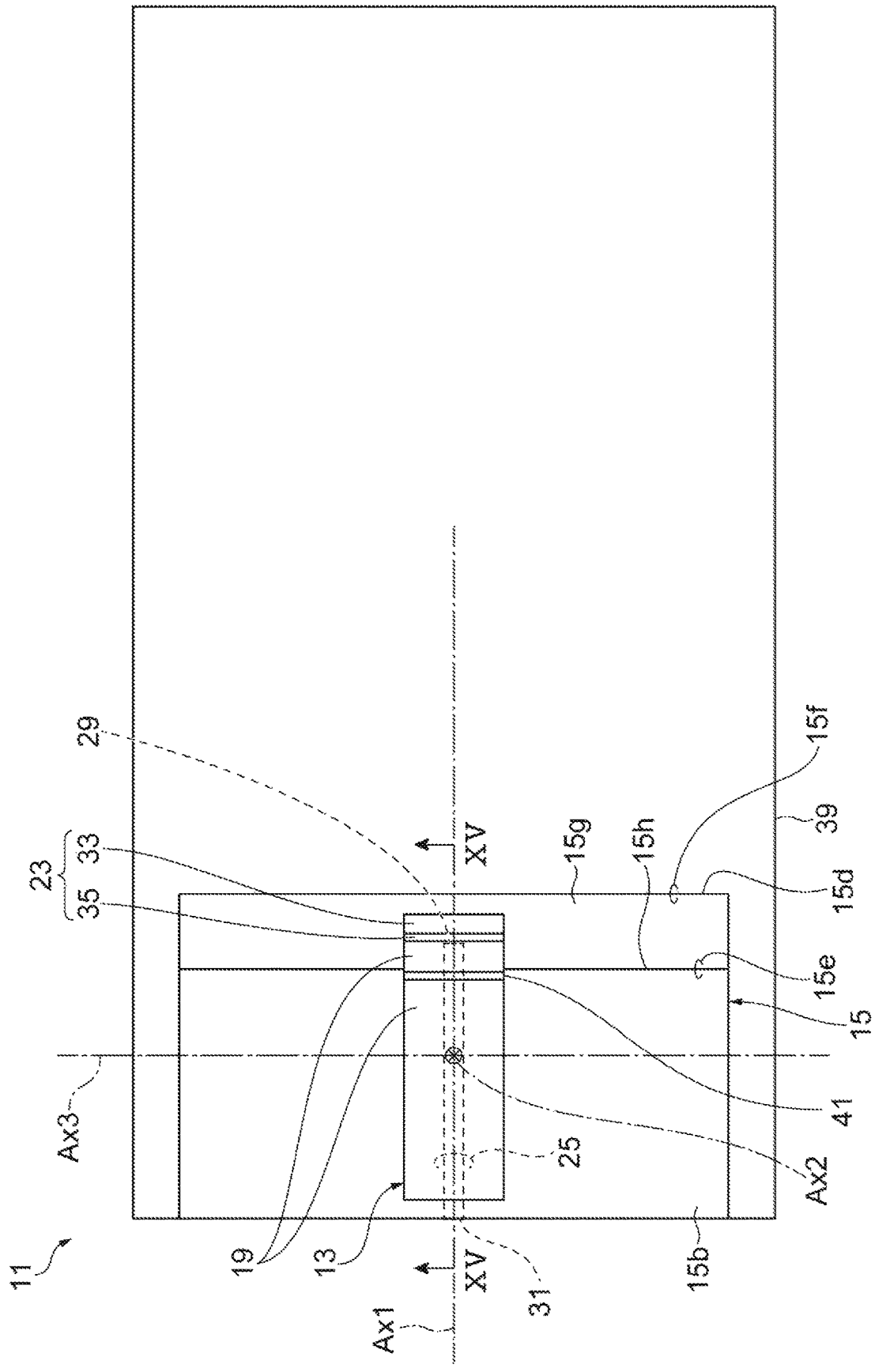
FIG. 16 is a schematic plan view showing the light emitting apparatus and the quantum cascade laser according to Example 4.

A light emitting apparatus according to a fourth embodiment will be described with reference to FIGS. 15 and 16. The quantum cascade laser 13 according to the fourth embodiment may have a protrusion 41 at the boundary between the second and third regions 17d and 17e. The protrusion 41 is provided on the first electrode 19 and may extend in the direction of the third axis Ax3 from one side face of the quantum cascade laser 13 to the other side face. The quantum cascade laser 13 is provided with the protrusion 41, which can be positioned to the front edge 15e (the side end face 15h) of the mounting face 15c on the conductive layer 15b of the submount 15. The protrusion 41 may include a dielectric material, such as $SiO_2$, SiON, SiN, alumina, benzocyclobutene (BCB), and polyimide. The protrusion 41 in this example is an exemplary alignment marker on the surface of the device, but the present invention is not limited thereto. Other markers, including a concave pattern formed by etching the upper electrode, can be used in the quantum cascade laser 13. If necessary, the quantum cascade laser 13 may be, however, aligned with the end face 15d (a marker) of the submount 15 at the rear end thereof, which mounts the reflecting structure 23, to position the quantum cascade laser 13 to the conductive layer 15b of the submount 15.

The end face 15d of the submount 15 extends along the reference plane REF, and the quantum cascade laser 13 does not protrude beyond the reference plane REF. The light emitting apparatus 11 causes the quantum cascade laser 13 to be set back with respect to the reference plane REF, reducing the possibility of accidental damages. The set-back amount of SB is independent of the length of the recessed face 15g.

The quantum cascade laser 13 according to the first to third embodiments and the following embodiments each may have the protrusion 41 according to the fourth embodiment.

Example 5

Figure 17:
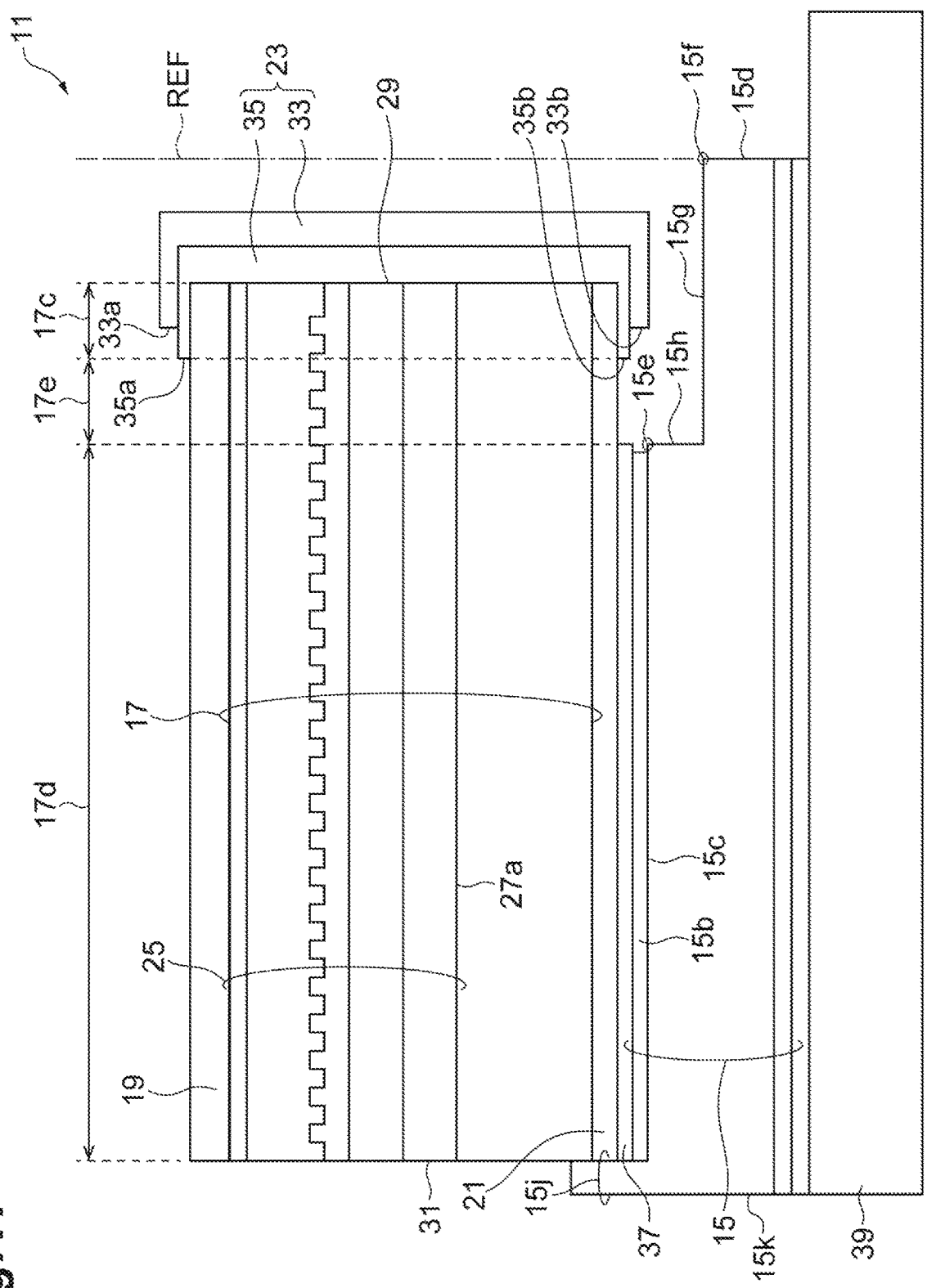
FIG. 17 is a cross-sectional view showing a light emitting apparatus and a quantum cascade laser according to Example 5.
Figure 18:
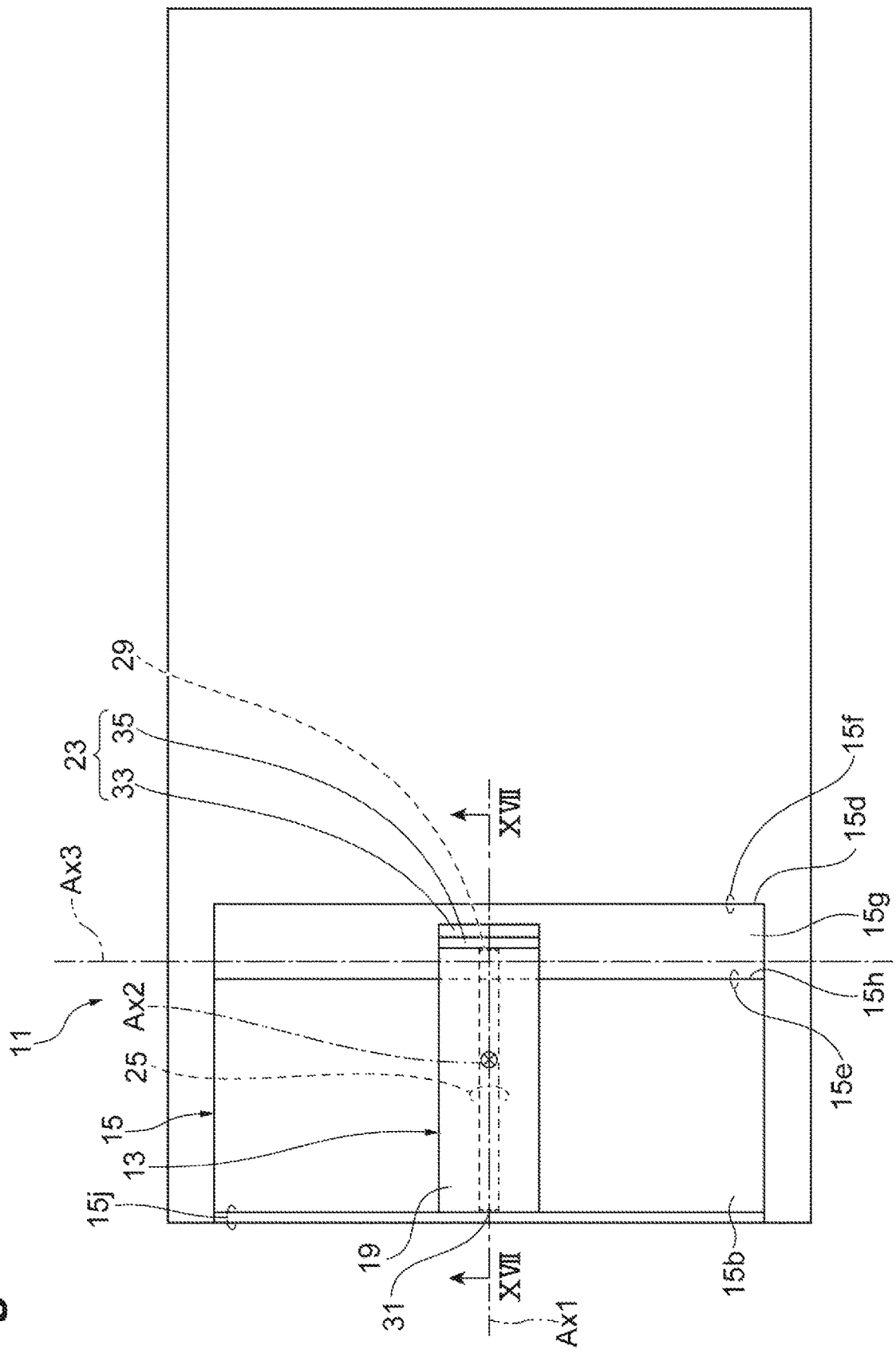
FIG. 18 is a schematic plan view showing the light emitting apparatus and the quantum cascade laser according to Example 5.

With reference to FIGS. 17 and 18, a light emitting apparatus according to a fifth embodiment will be described below. FIG. 17 is a cross-sectional view taken along the line XVII-XVII shown in FIG. 18. In the light emitting apparatus 11 according to the fifth embodiment, the submount 15 includes a protrusion 15j, which is raised with respect to the mounting face 15c. The protrusion 15j has a height sufficiently lower than that of the core layer of the quantum cascade laser 13 and is, for example, lower than the height of the principal surface 27a of the substrate 27. The protrusion 15j is positioned to the second end face 31, which is opposite to the first end face 29 of the quantum cascade laser 13, in the direction of the first axis Ax1. In the light emitting apparatus 11, positioning the quantum cascade laser 13 with the second end face 31 determines the position of the second end face 31 with respect to the submount 15 accurately. In the present embodiment, the protrusion 15j is disposed at the other end 15k located on the opposite side of the end face 15d.

The submount 15 according to first to third embodiments and the subsequent embodiments can use the protrusion 15j according to the fifth embodiment.

Example 6

Figure 19:
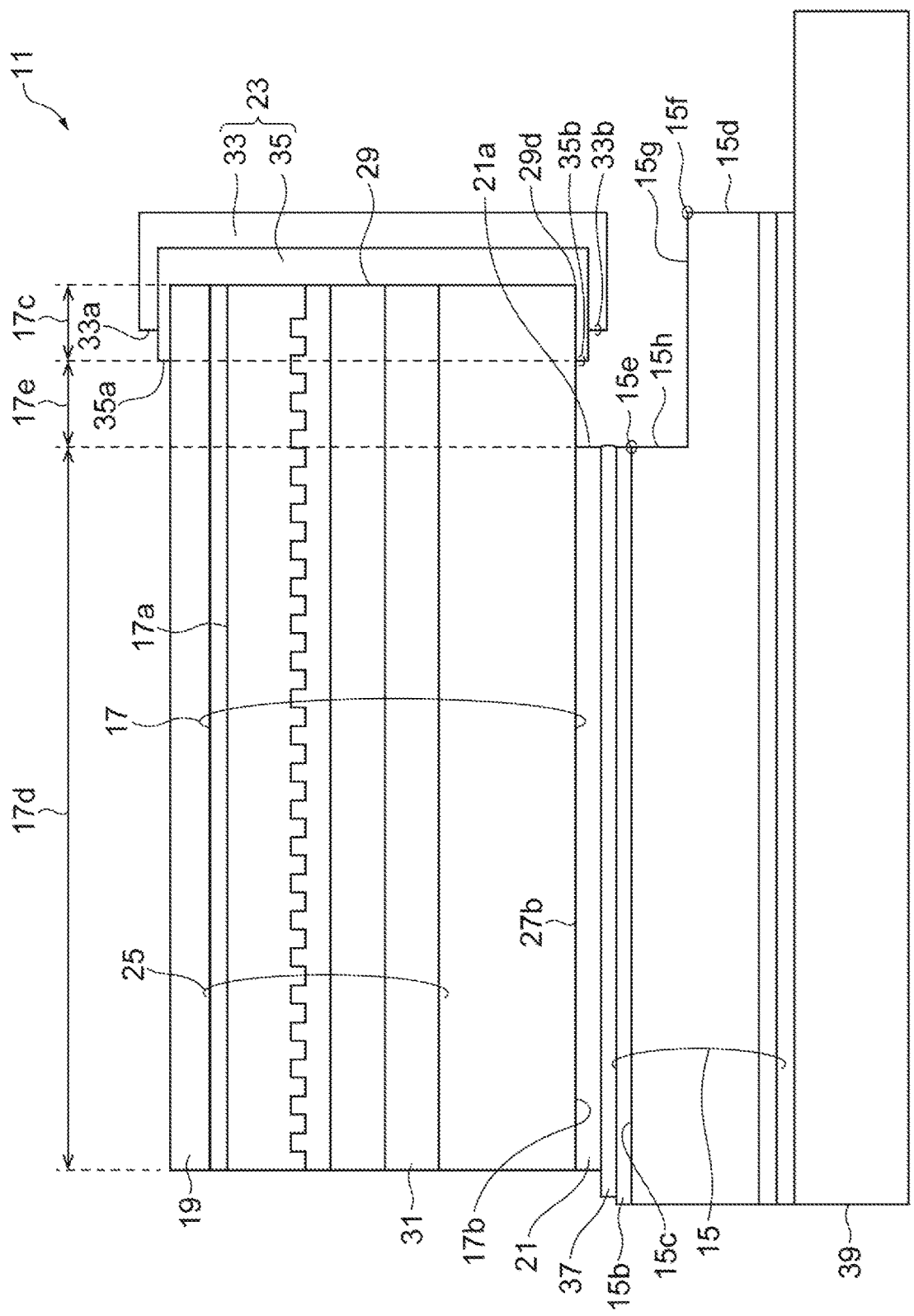
FIG. 19 is a cross-sectional view showing a light emitting apparatus and a quantum cascade laser according to Example 6.

A light emitting apparatus according to a sixth embodiment will be described with reference to FIGS. 10 and 19. FIG. 19 is a cross-sectional view taken along the line IX-IX shown in FIG. 10. In the light emitting apparatus 11 according to Example 6, the second electrode 21 of the quantum cascade laser 13 makes contact with the back face 27b of the substrate 27, and has an edge 21a apart from the lower end 29d of the first end face 29. Specifically, the second electrode 21 is disposed on the second face 17b in the second region 17d of the laser structure 17, and is not disposed on the second face 17b in the first and third regions 17c and 17e. In the light emitting apparatus 11, the second electrode 21 may not reach the first end face 29.

The reflecting structure 23 is separated from the edge 21a of the second electrode 21, and specifically, the edge 21a is away from the second edges 35b and 33b of the insulating and metal films 35 and 33 of the reflecting structure 23. The insulating film 35 makes contact with the second face 17b and can isolate the metal film 33 from the second face 17b (the back surface 27b of the substrate 27). The interval between the edge 21a of the second electrode 21 and the second edges (i.e., the second edge 33b and the second edge 35b) of the reflecting structure 23 can be, for example, 10 nm or more, which ensures electrical isolation, and can be 100 nm or less, which can provide careers with a flowing path.

The quantum cascade laser 13 according to Examples 1 to 5 and the subsequent examples can use the second electrode 21 according to Example 6.

Example 7

Figure 20:
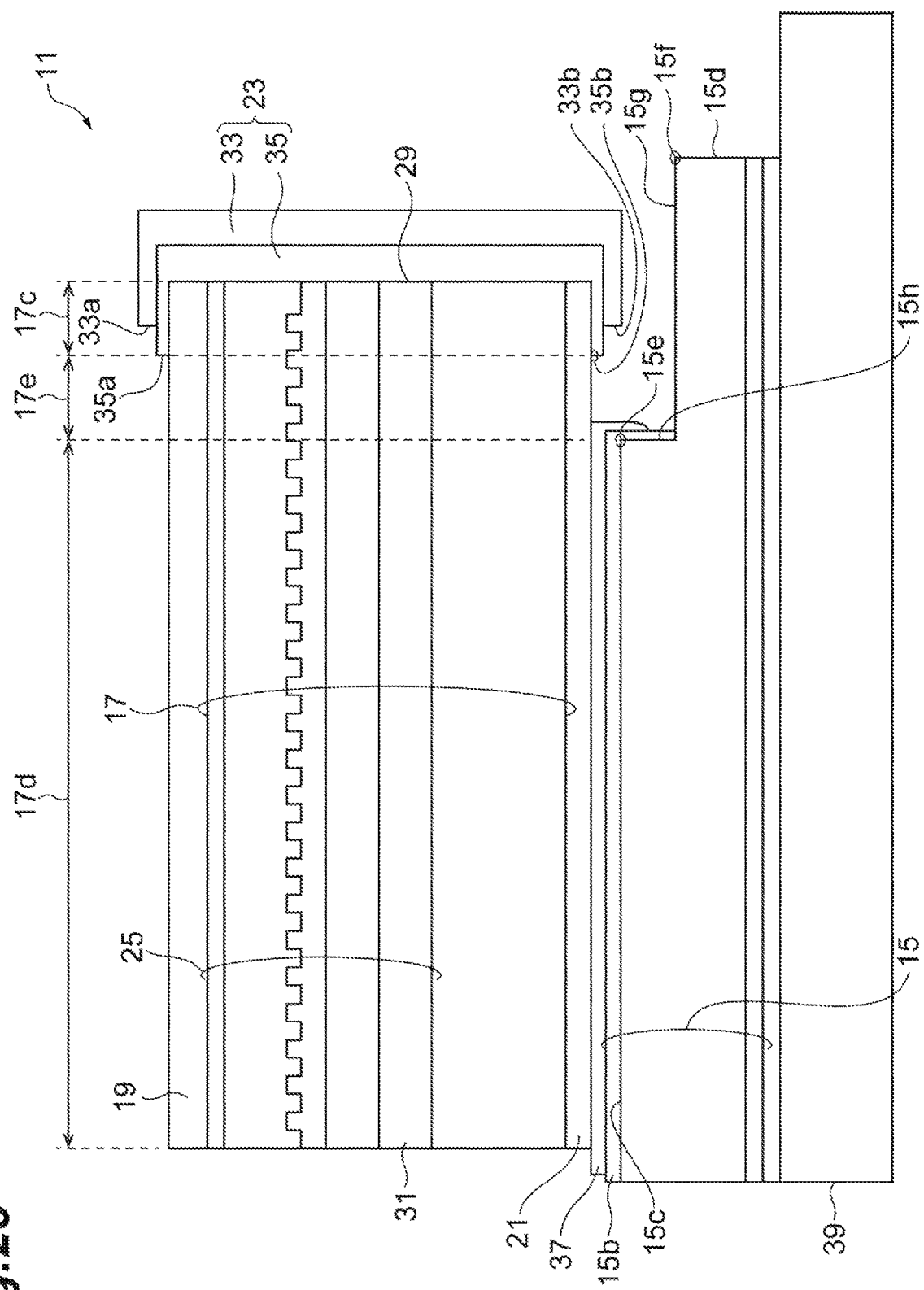
FIG. 20 is a cross-sectional view showing a light emitting apparatus and a quantum cascade laser according to Example 7.

With reference to FIG. 20, a light emitting apparatus according to a seventh example will be described below. In the light emitting apparatus 11 according to the seventh embodiment, the conductive layer 15b of the submount 15 extends from the mounting face 15c to the side end face 15h via the front edge 15e. The conductive layer 15b allows an excess of molten solder on the conductive layer 15b to flow along the conductive layer. The conductive layer 15b on the side end face 15h can remove a part of the excess of molten solder from the mounting face. This removal can hinder the solder material 37, which bonds the quantum cascade laser 13 and the conductive layer 15b with each other, from reaching the reflecting structure 23.

The quantum cascade laser 13 according to the first to sixth embodiments can use the second electrode 21 according to the seventh embodiment.

The submount 15 and the quantum cascade laser 13 are not limited to the specific examples described above in the embodiments.

The above embodiments hinder the solder material 37 on the submount 15 from coining into contact with the metal film 33 for high reflection on the end face, thereby avoiding short-circuits through the metal film 33 in the reflecting structure 23.

Having described and illustrated the principle of the invention in a preferred embodiment thereof, it is appreciated by those having skill in the art that the invention can be modified in arrangement and detail without departing from such principles. We therefore claim all modifications and variations coining within the spirit and scope of the following claims.

What is claimed is:

1. A light emitting apparatus comprising:
   a submount including a mounting face and an end face, the submount having a conductive layer on the mounting face, and the end face having an upper edge apart from a front edge of the mounting face; and
   a quantum cascade laser disposed on the front edge and the mounting face, the quantum cascade laser including:
      a laser structure having a waveguide mesa extending in a direction of a first axis and a substrate mounting the waveguide mesa, the laser structure having a first face, a second face, and a first end face, the first end face terminating the waveguide mesa, and the first face and the second face being arranged in a direction of a second axis intersecting that of the first axis;
      a first electrode disposed on the first face;
      a second electrode disposed on the second face; and
      a reflecting structure on the laser structure,
      the laser structure having a first region, a second region, and a third region, the first region, the second region, and the third region of the laser structure being arranged in the direction of the first axis, the first region of the laser structure having the end face, the mounting face supporting the second region of the laser structure, and in the laser structure, the third region being disposed between the first region and the second region,
      the reflecting structure including an insulating film and a metal film,
      the metal film having a first end on the first face in the first region, and a second end on the second face in the first region, and the metal film extending on the first electrode, the first end face, and the second electrode from the first end thereof to the second end thereof, and
      the insulating film having a first end on the first face in the first region, and a second end on the second face in the first region, the insulating film being in contact with the first end face and extending from the first end thereof to the second end thereof, and the insulating film being disposed between the laser structure and the first end and the second end of the metal film, wherein
   the submount has a difference in level at the front edge of the mounting face, and a recessed face extending from the upper edge of the end face to a bottom of the difference in level,
   the submount has a side end face at the difference in level, and the side end face extends from the mounting face to the recessed face, and
   the recessed face is apart from the reflecting structure.

2. The light emitting apparatus according to claim 1, wherein
   the end face of the submount extends along a reference plane intersecting the first axis, and
   the quantum cascade laser does not extend beyond the reference plane.

3. The light emitting apparatus according to claim 1, wherein
   the laser structure has a second end face opposite to the first end face, the submount has a protrusion protruding from the mounting face, and the protrusion positions the second end face of the quantum cascade laser.

4. The light emitting apparatus according to claim 1, Wherein the second electrode is in contact with the substrate, and has an edge apart from a lower edge of the first end face.

5. The light emitting apparatus according to claim 1, wherein the conductive layer of the submount is disposed on the side end face.

6. The light emitting apparatus according to claim 1, further comprising a solder material fixing the second electrode to the conductive layer.

7. A light emitting apparatus comprising:
a submount including a mounting face and an end face, the submount having a conductive layer on the mounting face, and the end face having an upper edge apart from a front edge of the mounting face; and
a quantum cascade laser disposed on the front edge and the mounting face, the quantum cascade laser including:
a laser structure having a waveguide mesa extending in a direction of a first axis and a substrate mounting the waveguide mesa, the laser structure having a first face, a second face, and a first end face, the first end face terminating the waveguide mesa, and the first face and the second face being arranged in a direction of a second axis intersecting that of the first axis;
a first electrode disposed on the first face;
a second electrode disposed on the second face; and
a reflecting structure on the laser structure,
the laser structure having a first region, a second region, and a third region, the first region, the second region, and the third region of the laser structure being arranged in the direction of the first axis, the first region of the laser structure having the end face, the mounting face supporting the second region of the laser structure, and in the laser structure, the third region being disposed between the first region and the second region,
the reflecting structure including an insulating film and a metal film,
the metal film having a first end on the first face in the first region, and a second end on the second face in the first region, and the metal film extending on the first electrode, the first end face, and the second electrode from the first end thereof to the second end thereof, and
the insulating film having a first end on the first face in the first region, and a second end on the second face in the first region, the insulating film being in contact with the first end face and extending from the first end thereof to the second end thereof, and the insulating film being disposed between the laser structure and the first end and the second end of the metal film, wherein
the submount has one or more grooves terminating the mounting face and extending in a direction of a third axis intersecting that of the first axis and that of the second axis,
the submount has a first region, a second region, and a third region arranged in the direction of the first axis, the first region of the submount has the end face, the second region of the submount has the mounting face, and the third region of the submount has the one or more grooves, and in the submount, the third region is disposed between the first region and the second region, and the submount supports the quantum cascade laser on the first region and the second region thereof.

8. The light emitting apparatus according to claim 7, wherein
the end face of the submount extends along a reference plane intersecting the first axis, and
the quantum cascade laser does not extend beyond the reference plane.

9. The light emitting apparatus according to claim 7, wherein
the laser structure has a second end face opposite to the first end face,
the submount has a protrusion protruding from the mounting face, and
the protrusion positions the second end face of the quantum cascade laser.

10. The light emitting apparatus according to claim 7, wherein the second electrode is in contact with the substrate, and has an edge apart from a lower edge of the first end face.

11. The light emitting apparatus according to claim 7, further comprising a solder material fixing the second electrode to the conductive layer.

12. A quantum cascade laser comprising:
a laser structure including a waveguide mesa extending in a direction of a first axis, and a substrate mounting the waveguide mesa, the laser structure including a first end face, a first face and a second face opposite the first face, the first end face terminating the waveguide mesa, and the first face and the second face being arranged in a direction of a second axis intersecting that of the first axis;
a first electrode disposed on the first face;
a second electrode disposed on the second face; and
a reflecting structure on the laser structure,
the laser structure including a first region, a second region, and a third region, the first region, the second region, and the third region being arranged in the direction of the first axis, the first region having the first end face, and the third region being disposed between the first region and the second region,
the reflecting structure being disposed in the first region and including an insulating film and a metal film,
the metal film having a first end on the first face in the first region, and a second end on the second face in the first region, and the metal film being disposed on the first electrode, the second electrode, and the first end face in extending from the first end thereof to the second end thereof,
the insulating film having a first end on the first face in the first region, and a second end on the second face in the first region, and the insulating film extending from the first end thereof to the second end thereof, and the insulating film being in contact with the first end face,
a distance between the first end of the metal film and the first end of the insulating film being in a range of 10 to 10 nm, and
a distance between the second end of the metal film and the second end of the insulating film being in a range of 10 to 10 nm.

13. The quantum cascade laser according to claim 12, wherein the laser structure is disposed between the first and the second ends of the metal film.

14. The quantum cascade laser according to claim 12, wherein the insulating film is in direct contact with a top face of the first electrode on the first face in the first region, and the insulating film in direct contact with a top face of the second electrode on the second face in the first region.

15. The quantum cascade laser according to claim 14, wherein the first electrode is in direct contact with a top face of the waveguide mesa on the first face and extends over the top face of the waveguide mesa, and the second electrode is in direct contact with the substrate on the second face.

16. The quantum cascade laser according to claim 12, wherein the insulating film separates the first electrode from the metal film on the first face in the first region, and the insulating film separates the second electrode from the metal film on the second face in the first region.

17. The quantum cascade laser according to claim 12, wherein the laser structure includes a second end face opposite the first end face, the second end face being uncovered such that light is emitted directly from the second end face.

18. The quantum cascade laser according to claim 12, wherein the insulating film has a thickness in a range of 100 to 300 nm on the first end face.

19. The quantum cascade laser according to claim 12, wherein the insulating film is $SiO_2$, SiON, or SiN.

20. The quantum cascade laser according to claim 12, wherein the insulating film is benzocyclobutene or polyimide.

21. The quantum cascade laser according to claim 12, wherein the insulating film is alumina.

22. The quantum cascade laser according to claim 12, wherein the laser structure includes a semi-insulating semiconductor embedding region embedding side faces of the waveguide mesa, and the first electrode makes direct contact with a top face of the semi-insulating semiconductor embedding region and a top face of the waveguide mesa.

23. The quantum cascade laser according to claim 22, wherein the laser structure includes a second end face opposite the first end face, and the first electrode extends from the first end face to the second end face.

24. The quantum cascade laser according to claim 23, wherein the second electrode extends from the first end face to the second end face.

25. The quantum cascade laser according to claim 21, wherein the waveguide mesa includes a core layer and a diffraction grating structure extending along the core layer.

* * * * *